US009691737B2

(12) United States Patent
Kim

(10) Patent No.: US 9,691,737 B2
(45) Date of Patent: Jun. 27, 2017

(54) SEMICONDUCTOR DEVICE

(71) Applicant: Samsung Electronics Co., Ltd., Suwon-si, Gyeonggi-do (KR)

(72) Inventor: Kil-Soo Kim, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/636,239

(22) Filed: Mar. 3, 2015

(65) Prior Publication Data

US 2015/0357310 A1     Dec. 10, 2015

(30) Foreign Application Priority Data

Jun. 5, 2014   (KR) ................. 10-2014-0068419

(51) Int. Cl.
*H01L 25/065*     (2006.01)
*H01L 23/498*     (2006.01)
(Continued)

(52) U.S. Cl.
CPC ........ *H01L 25/0657* (2013.01); *H01L 23/481* (2013.01); *H01L 23/49838* (2013.01); *H01L 23/50* (2013.01); *H01L 24/49* (2013.01); *H01L 2224/0401* (2013.01); *H01L 2224/04042* (2013.01); *H01L 2224/06135* (2013.01); *H01L 2224/32145* (2013.01); *H01L 2224/48091* (2013.01); *H01L 2224/48106* (2013.01); *H01L 2224/48227* (2013.01); *H01L 2224/73265* (2013.01); *H01L 2225/0651* (2013.01); *H01L 2225/06506* (2013.01);
(Continued)

(58) Field of Classification Search
CPC ........... H01L 25/0657; H01L 23/49838; H01L 23/481; H01L 24/49; H01L 23/50
USPC ................................................. 257/774, 777
See application file for complete search history.

(56) References Cited

U.S. PATENT DOCUMENTS 6,486,702 B1   11/2002   Ngai et al.
8,258,619 B2    9/2012   Foster, Sr. et al.
(Continued)

FOREIGN PATENT DOCUMENTS

JP   2001-168294 A    6/2001
JP   2003-347502 A   12/2003

*Primary Examiner* — Walter H Swanson
(74) *Attorney, Agent, or Firm* — Harness, Dickey & Pierce, PLC

(57) ABSTRACT

Provided is a semiconductor device having as many input/output pads as possible using a chip having a small number of input/output pads. The semiconductor device includes a substrate including first and second extending input/output pads, a first memory structure disposed on the substrate and including first connecting input/output pads, a second memory structure disposed on the first memory structure and including second connecting input/output pads, and a wiring structure formed on lateral surfaces of the first and second memory structures and connecting the first and second connecting input/output pads and the first and second extending input/output pads, respectively; wherein the wiring structure includes a first wiring connecting the first connecting input/output pads and the first extending input/output pad and a second wiring connecting the first connecting input/output pads and the second extending input/output pad, and the second wiring is offset relative to the first wiring.

16 Claims, 18 Drawing Sheets

(51) Int. Cl.
*H01L 23/48* (2006.01)
*H01L 23/00* (2006.01)
*H01L 23/50* (2006.01)

(52) U.S. Cl.
CPC ........... *H01L 2225/06513* (2013.01); *H01L 2225/06517* (2013.01); *H01L 2225/06541* (2013.01); *H01L 2225/06544* (2013.01); *H01L 2225/06562* (2013.01); *H01L 2225/06565* (2013.01); *H01L 2924/00014* (2013.01); *H01L 2924/1434* (2013.01); *H01L 2924/1436* (2013.01); *H01L 2924/157* (2013.01); *H01L 2924/1579* (2013.01); *H01L 2924/15787* (2013.01); *H01L 2924/15788* (2013.01)

(56) References Cited

U.S. PATENT DOCUMENTS

| | | |
|---|---|---|
| 8,476,767 B2 | 7/2013 | Lee |
| 8,549,447 B2 | 10/2013 | Eisenstadt |
| 2010/0265751 A1* | 10/2010 | Hong ............... G11C 5/06 365/51 |
| 2012/0168965 A1* | 7/2012 | Masuda ............ B82Y 10/00 257/777 |
| 2012/0201068 A1 | 8/2012 | Ware |
| 2013/0093099 A1 | 4/2013 | Shin et al. |
| 2013/0214389 A1 | 8/2013 | Lee et al. |
| 2014/0328015 A1* | 11/2014 | Crisp ............... H01L 23/49816 361/679.32 |

\* cited by examiner

SEMICONDUCTOR DEVICE

CROSS-REFERENCE TO RELATED APPLICATION

This application claims priority from Korean Patent Application No. 10-2014-0068419 filed on Jun. 5, 2014 in the Korean Intellectual Property Office, and all the benefits accruing therefrom under 35 U.S.C. 119, the contents of which in its entirety are herein incorporated by reference.

BACKGROUND

1. Technical Field

The present inventive concepts relates to a semiconductor device.

2. Description of the Related Art

In semiconductor devices, bandwidth is typically used in measuring performance of a memory. The bandwidth is proportional to a frequency, which may correspond to a speed of the memory, and is also proportional to the number of input/output pads of the memory. Many studies are related with development of methods for increasing the frequency, but there is a limit in increasing the frequency. Therefore, to enhance the memory performance, increasing the number of input/output pads, rather than increasing the frequency, is taken into consideration.

A wide input/output (I/O) device is a type of memory device having a plurality of input/output pads.

SUMMARY

According to an aspect of the present inventive concepts, there is provided a semiconductor device including a substrate including first and second extending input/output pads, a first memory structure disposed on the substrate and including first connecting input/output pads, a second memory structure disposed on the first memory structure and including second connecting input/output pads, and a wiring structure formed on lateral surfaces of the first and second memory structures and connecting the first and second connecting input/output pads and the first and second extending input/output pads respectively, wherein the wiring structure includes a first wiring connecting the first connecting input/output pads and the first extending input/output pad and a second wiring connecting the first connecting input/output pads and the second extending input/output pad, and the second wiring is offset relative to the first wiring.

The first memory structure includes a plurality of memory chips.

The plurality of memory chips include a first memory chip and a second memory chip disposed on the first memory chip, the first connecting input/output pads include a first input/output pad included in the first memory chip and a second input/output pad included in the second memory chip, and the second memory chip includes a through via passing through the second memory chip and connecting the first and second input/output pads.

The plurality of memory chips include a first memory chip and a second memory chip disposed on the first memory chip, the first connecting input/output pads include a first input/output pad included in the first memory chip and a second input/output pad included in the second memory chip, and the first wiring connects the first extending input/output pad and the first and second input/output pads.

The semiconductor device may further comprising a third memory structure disposed on the first memory structure and including a third connecting input/output pad, wherein the extending input/output pads include a third extending input/output pad, the wiring structure further includes a third wiring connecting the third connecting input/output pad and the third extending input/output pad, and the third wiring is offset relative to the first and second wirings along edges of the first to third memory structures.

The substrate further includes an extending power pad connected to a power supply and an extending ground pad that is grounded, the first memory structure further includes a power pad and a ground pad, the wiring structure further includes a power wiring connecting the power pad and the extending power pad and a ground wiring connecting the ground pad and the extending ground pad, and the power wiring or the ground wiring are disposed between the first and second wirings.

The first input/output pad is positioned at an edge of the first memory structure and the first memory structure is electrically connected to the first input/output pad and further includes a center pad centrally positioned in the first memory structure.

The semiconductor device may further comprising an interposer positioned between the substrate and the first memory structure, wherein the interposer includes first and second interposer pads to which the first and second wirings are connected, respectively, and first and second extending interposer pads to which the first and second extending input/output pads are connected, respectively, the first and second interposer pads are arranged at a first distance, the first and second extending interposer pads are arranged at a second distance, and the second distance is greater than or equal to the first distance.

The wiring structure includes a plurality of protrusion parts coupled to the first and second memory structures, and the protrusion parts are brought into contact with the first and second connecting input/output pads, respectively.

The wiring structure includes a bonding wire.

According to another aspect of the present inventive concepts, there is provided a semiconductor device including a substrate including first and second extending input/output pads, a first memory structure disposed on the substrate and including a first input/output pad, a second memory structure disposed on the first memory structure and including a second input/output pad connected to the first input/output pad, a third memory chip disposed on the second memory chip and including a third input/output pad, a fourth memory chip disposed on the third memory chip and including a fourth input/output pad connected to the third input/output pad, a first connection part formed on lateral surfaces of the first and second chips and electrically connecting the first and second input/output pads and the first extending input/output pad, and a second connection part formed on lateral surfaces of the first to fourth chips and electrically connecting the third and fourth input/output pads and the second extending input/output pad, wherein the first to fourth memory chips are disposed to overlap with the first to fourth input/output pads, and the second extending input/output pad is positioned farther from the third and fourth input/output pads than the first extending input/output pad.

The second memory chip further includes a through via connecting the first and second input/output pads to each other.

Each of the first to fourth memory chips includes a dynamic random access memory (DRAM).

The semiconductor device may further comprising a connection unit including first and second connection parts, wherein the connection unit includes protrusion parts inserted into at least a portion in a space between the first to fourth memory chips.

The first connection part includes a bonding wire.

BRIEF DESCRIPTION OF THE DRAWINGS

The above and other features and advantages of the present inventive concepts will become more apparent by describing in detail preferred embodiments thereof with reference to the attached drawings in which.

DETAILED DESCRIPTION OF THE EMBODIMENTS

Figure 1:
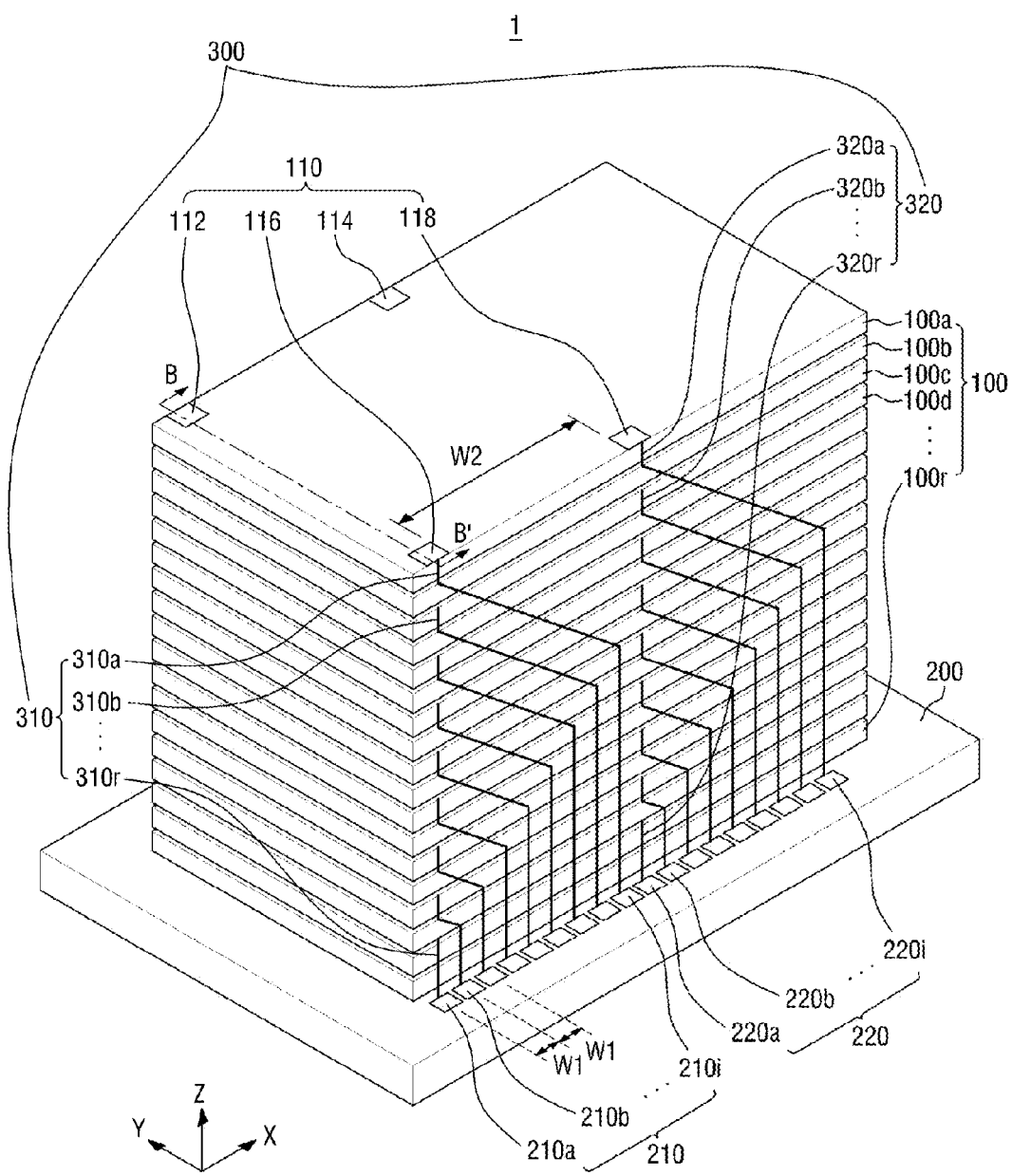
FIG. 1 is a conceptual perspective view for explaining a configuration of a semiconductor device according to an embodiment of the present inventive concepts.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concepts of the inventive concepts to those skilled in the art, and the present inventive concepts will only be defined by the appended claims. Like reference numerals refer to like elements throughout the specification.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

First, a semiconductor device according to a first embodiment of the present inventive concepts will be described with reference to FIGS. 1 to 3.

Figure 2:
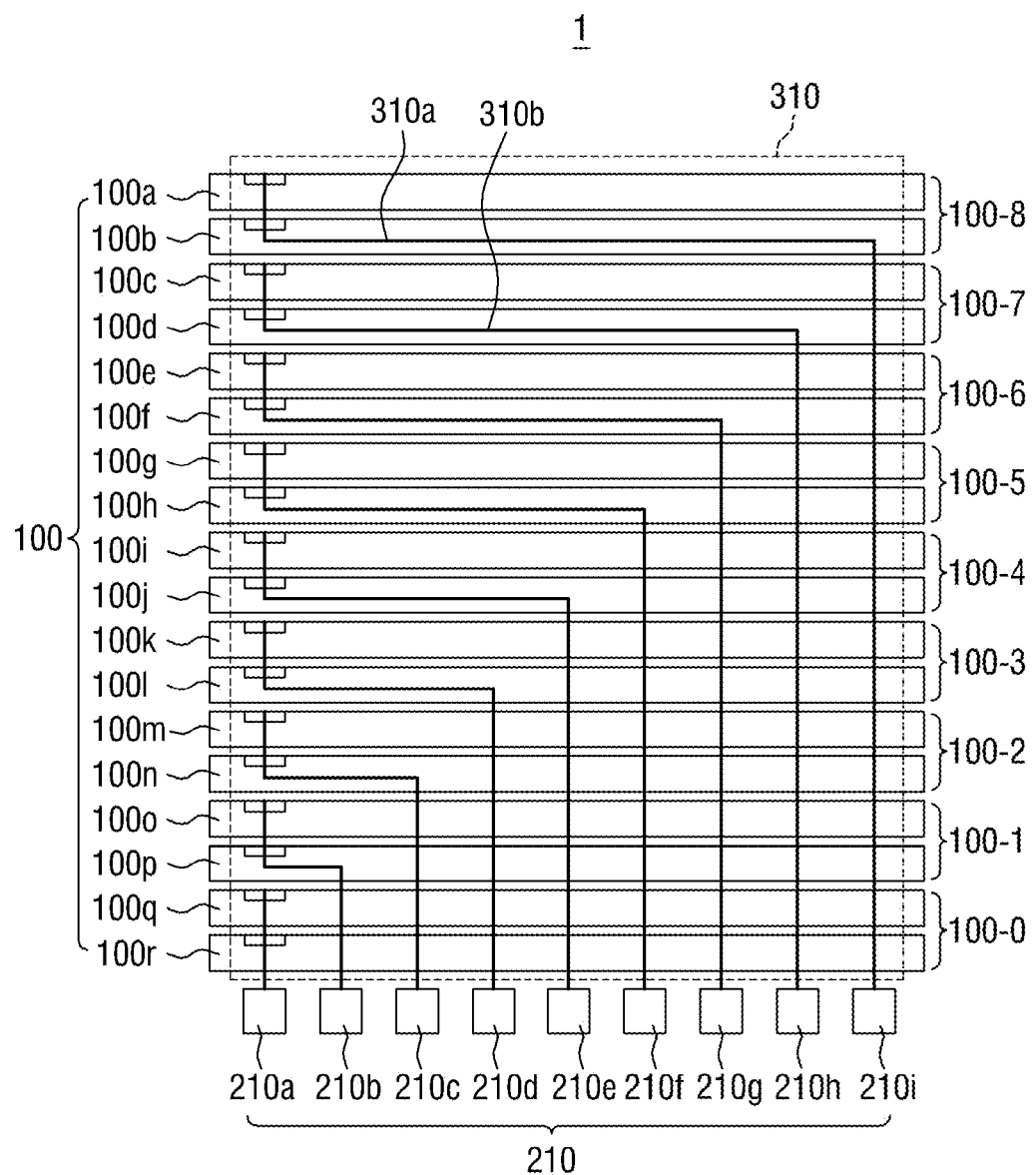
FIG. 2 is a conceptual front view for explaining a semiconductor device according to an embodiment of the present inventive concepts.
Figure 3:
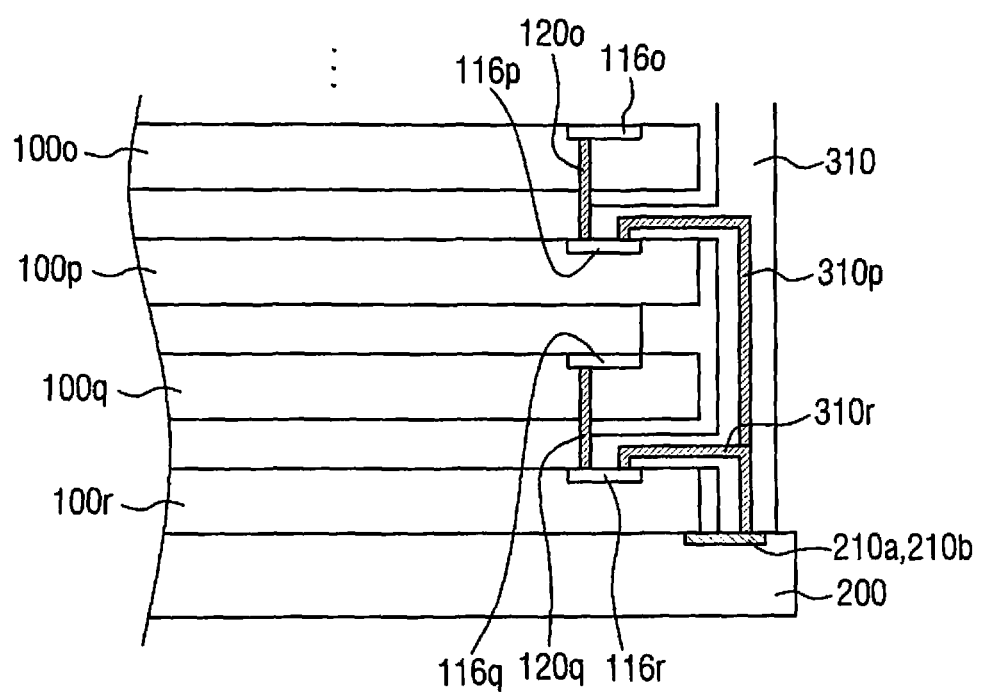
FIG. 3 is a partially cut-away side view for explaining a semiconductor device according to an embodiment of the present inventive concepts.

FIG. 1 is a conceptual perspective view for explaining a configuration of a semiconductor device according to an embodiment of the present inventive concepts, FIG. 2 is a conceptual front view for explaining a semiconductor device according to an embodiment of the present inventive concepts and FIG. 3 is a partially cut-away side view for explaining a semiconductor device according to an embodiment of the present inventive concepts.

Referring to FIG. 1, the semiconductor device 1 includes a substrate 200, a stack structure 100 and a wiring structure 300.

The substrate 200 may be formed of a silicon (Si) substrate, a silicon on insulator (SOI) substrate, a gallium arsenic (GaAs) substrate, a ceramic substrate, a quartz substrate, a rigid substrate such as a glass substrate for display, or a flexible plastic substrate made of polyimide, polyester, polycarbonate, polyethersulfone, polymethylmethacrylate, polyethylene naphthalate, or polyethyleneterephthalate.

The substrate 200 may include extending input/output pads 210 and 220 on its top surface. The extending input/output pads 210 and 220 may be plurally provided. The extending input/output pads 210 and 220 may be separated from each other. The extending input/output pads 210 and 220 may be formed of conductors. The extending input/output pads 210 and 220 may be connected to wirings to serve as nodes that facilitate an electrical connection with another part.

The extending input/output pads 210 and 220 may be arranged in one direction from a lateral surface of the stack structure 100. The respective extending input/output pads 210 and 220 may be disposed to be spaced a first distance w1 apart from other extending input/output pads 210 and 220 adjacent thereto. The extending input/output pads 210 and 220 may include a first extending input/output pad 210a and a second extending input/output pad 210b.

The stack structure 100 may be configured such that a plurality of memory chips 100a, . . . , and 100r are stacked. The number of the plurality of memory chips 100a, . . . , and 100r is not particularly limited. The stack structure 100 may be configured such that the plurality of memory chips 100a, . . . , and 100r are aligned and stacked. In an embodiment, the plurality of memory chips 100a, . . . , and 100r may be all of the same type. The memory chips 100a, . . . , and 100r may be, for example, DRAMs, but not limited thereto.

Each of the memory chips 100a, . . . , and 100r may include an input/output pad 110. The input/output pad 110 may be a terminal for inputting/outputting signals for operations of the memory chips 100a, . . . , and 100r. The input/output pad 110 of each of the memory chips 100a, . . . , and 100r may be plurally provided. The number of the input/output pads 110 may be determined as $2^n$ (n is a natural number), e.g., 2 ($2^1$), 4 ($2^2$), 8 ($2^3$), . . . , etc., but not limited thereto.

The input/output pad 110 may plurally exist on one of the memory chips 100a, . . . , and 100r. In an embodiment, the number of input/output pad 110 plurally existing on one of the memory chips 100a, . . . , and 100r may be smaller than the number of the extending input/output pads 210 and 220. Each of the input/output pads 110 may be spaced a second distance w2 apart from other input/output pads 110 adjacent thereto. The second space w2 may be greater than the first space w1.

Referring to FIG. 2, the stack structure 100 may include memory structures 100-0, . . . , and 100-8. That is to say, the stack structure 100 may include a plurality of memory structures 100-0, . . . , and 100-8. In detail, the memory structures 100-0, . . . , and 100-8 may include a plurality of memory chips 100a, . . . , and 100r. That is to say, in the stack structure 100, the plurality of memory chips 100a, . . . , and 100r may constitute one of the memory structures 100-0, . . . , and 100-8, and the memory structures 100-0, . . . , and 100-8 may constitute the stack structure 100. The memory structures 100-0, . . . , and 100-8 may include a plurality of memory chips 100a, . . . , and 100r. The respective memory structures 100-0, . . . , and 100-8 may include the same number of memory chips 100a, . . . , and 100r. In the illustrated embodiment shown in FIG. 2, all of the memory structures 100-0, . . . , and 100-8 included in two of the memory chips 100a, . . . , and 100r are exemplified.

The second space w2 may be equal to or greater than a multiplication product of the first space w1 and the number of memory structures 100-0, . . . , and 100-8. Accordingly, the second space w2 may be predefined according to the configuration of the stack structure 100. Therefore, the second space w2 can be adjusted according to the number of memory structures 100-0, . . . , and 100-8 of the stack structure 100. In an embodiment, the second space w2 may be adjusted according to the first space w1. Here, in a case where the second space w2 is first taken into consideration, the first space w1 may also be adjusted.

Referring to FIG. 3, the first memory structure 100-0 may be disposed on the substrate 200. The second memory structure 100-1 may be stacked on the first memory structure 100-0. The other memory structures 100-2, . . . , and 100-8 may be stacked on the second memory structure 100-1.

The first memory structure 100-0 includes first connecting input/output pads 116q and 116r and the second memory structure 100-1 includes first connecting input/output pads 116o and 116p. The first connecting input/output pads 116q and 116r are pads for inputting/outputting signals from/to the first memory structure 100-0 and the first connecting input/output pads 116o and 116p re pads for inputting/outputting signals from/to the second memory structure 100-1.

The first memory structure 100-0 may include a first memory chip 100r and a second memory chip 100q. The first memory chip 100r may be disposed on the substrate 200 and the second memory chip 100q may be disposed on the first memory chip 100r. The first memory chip 100r may include a first input/output pad 116r and the second memory chip 100q may include a second input/output pad 116q. The first memory chip 100r and the second memory chip 100q may be stacked such that the first input/output pad 116r and the second input/output pad 116q overlap with each other.

The first input/output pad 116r may be connected to the second input/output pad 116q. The second memory chip 100q may include a first through via 120q connecting the first input/output pad 116r and the second input/output pad 116q. The first through via 120q may be formed while passing through the second memory chip 100q. The first through via 120q may be a through silicon via (TSV), but not limited thereto.

The second memory structure 100-1 may include a third memory chip 100p and a fourth memory chip 100o. The third memory chip 100p may be disposed on the second memory chip 100q and the fourth memory chip 100o may be disposed on the third memory chip 100p. The third memory chip 100p may include a third input/output pad 116p and the fourth memory chip 100o may include a fourth input/output pad 116o. The third memory chip 100p and the fourth memory chip 100o may be stacked such that the third input/output pad 116p and the fourth input/output pad 116o overlap with each other.

The third input/output pad 116p may be connected to the fourth input/output pad 116o. The fourth memory chip 100o may include a second through via 120o connecting the third input/output pad 116p and the fourth input/output pad 116o. The second through via 120o may be formed while passing through the second memory chip 100q. The second through via 120o may be a through silicon via (TSV), but not limited thereto.

Referring again to FIGS. 1 and 3, the wiring structure 300 may be formed at a position where the lateral surface of the stack structure 100 is covered. In an embodiment, the wiring structure 300 may be positioned between the extending input/output pads 210 and 220 and the stack structure 100.

The wiring structure 300 may connect the input/output pad 110 and the extending input/output pads 210 and 220. The wiring structure 300 may include a first wiring 310r and a second wiring 310p. The first wiring 310r may connect the first connecting input/output pads 116q and 116r and the first extending input/output pad 210a and the second wiring 310p may connect the first connecting input/output pads 116o and 116p and the second extending input/output pad 210b. The second wiring 310p may be offset relative to the first wiring 310r.

In an embodiment, the first connecting input/output pads 116q and 116r of the first memory structure 100-0 and the first connecting input/output pads 116o and 116p of the second memory structure 100-1 may have the same horizontal position at different vertical levels, which is because the first memory structure 100-0 and the second memory structure 100-1 are aligned to then be stacked. In an embodiment, horizontal position of the first extending input/output pad 210a may overlap with or may be relatively close to the first connecting input/output pads 116q and 116r and the first connecting input/output pads 116o and 116p rather than a horizontal position of the second extending input/output pad 210b. The horizontal position of the second extending input/output pad 210b may be farther from horizontal positions of the first connecting input/output pads 116q and 116r and the second input/output pad 116q than horizontal position of the first extending input/output pad 210a. Therefore, the first wiring 310r may be formed without a bent portion or may be curved to a relatively small extent. The second wiring 310p may be curved to a greater extent than the first wiring 310r. Therefore, the second wiring 310p may be offset relative to the first wiring 310r due to the bent portion. The bent portions of the first wiring 310r and the second wiring 310p may be perpendicularly curved or may be diagonally curved at an obtuse angle. That is to say, shapes of the bent portions of the first wiring 310r and the second wiring 310p may be bent without limitation if only they are offset from each other.

Referring to FIG. 3, the first wiring 310r may be electrically connected to the first connecting input/output pads 116q and 116r. The first wiring 310r may be connected to the first input/output pad 116r, but aspects of the present inventive concepts are not limited thereto. The first wiring 310r may be connected to the second input/output pad 116q. That is to say, since the first input/output pad 116r are connected to the second input/output pad 116q, there is no limitation in the connection relationship between the first wiring 310r and the second input/output pad 116q as long as the first wiring 310r is electrically connected to the first input/output pad 116r and the second input/output pad 116q. In an embodiment, the first wiring 310r may also be connected to both of the first input/output pad 116r and the second input/output pad 116q.

In the illustrated embodiment, two memory structures are exemplified. However, the number of memory structures may be increased without limitation, as shown. Therefore, according to the present embodiment, a plurality of memory structures may be provided, or one of the plurality of memory structures may include two or more memory chips.

In the semiconductor device, a small number of input/output pads may be provided in one memory chip. However, the respective input/output pads may be branched through a plurality of stack structures to then connect the branched input/output pads to the extending input/output pads, thereby achieving the same effect as in a case where many input/output pads are provided. Therefore, since the number of input/output pads can be increased using chips fabricated at low cost, like in a wide I/O device, the semiconductor device 1 may have a relatively high bandwidth, compared to a memory device having the same capacity.

In addition, since a memory structure includes a plurality of memory chips, the number of the plurality of memory chips can be adjusted according to numbers of input/output terminals and extending input/output terminals. Therefore, the capacity and the number of extending input/output terminals are reciprocally adjusted, thereby increasing the degree of freedom of choice. That is to say, the semiconductor device having a desired capacity and including a desired number of input/output terminals can be easily fabricated.

A semiconductor device according to an embodiment of the present inventive concepts will be described with reference to FIG. 4.

Figure 4:
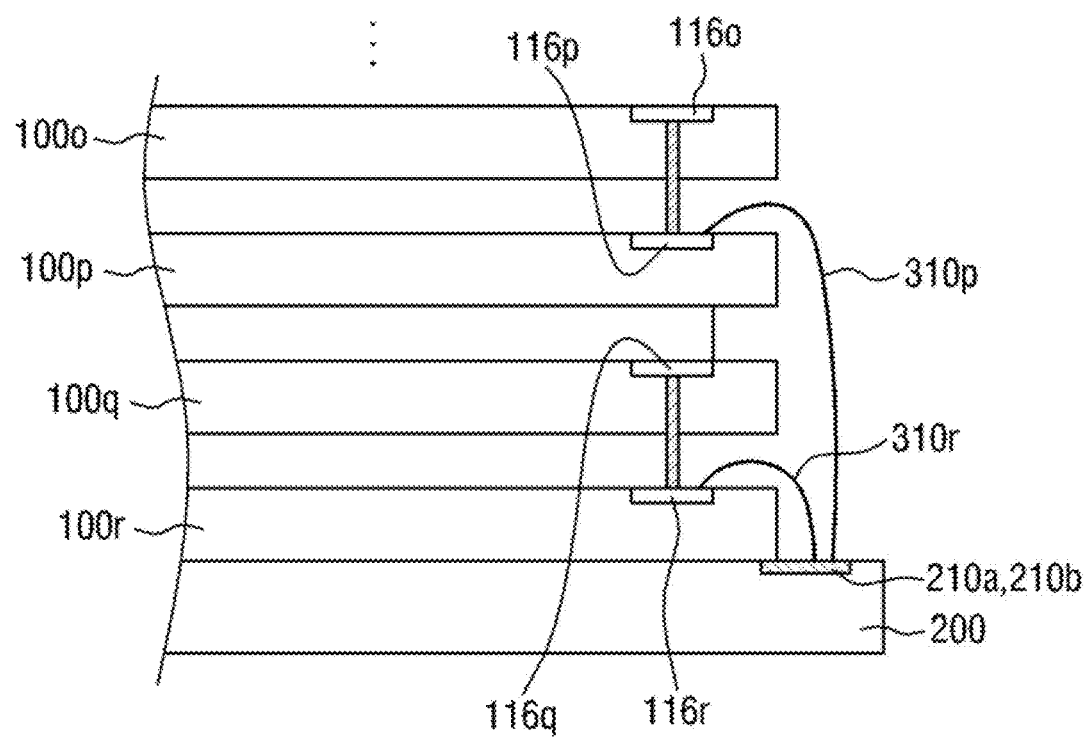
FIG. 4 is a partially cut-away side view for explaining a semiconductor device according to an embodiment of the present inventive concepts.

FIG. 4 is a partially cut-away side view for explaining a semiconductor device according to an embodiment of the present inventive concepts.

Referring to FIG. 4, in the semiconductor device 2 according to an embodiment of the present inventive concepts, a first wiring 310r and a second wiring 310p are bonding wires.

One end of the first wiring 310r may be bonded to first connecting input/output pads 116q and 116r. The one end of the first wiring 310r may be bonded to the first input/output pad 116r or the second input/output pad 116q. Since the first input/output pad 116r and the second input/output pad 116q are electrically connected, the first wiring 310r may be connected to either the first input/output pad 116r or the second input/output pad 116q. The first wiring 310r may be a wire formed of a conductor. The first wiring 310r may be, for example, a metal wire. The other end of the first wiring 310r may be bonded to a first extending input/output pad 210a.

One end of the second wiring 310p may be bonded to the first connecting input/output pads 116o and 116p. The one end of the second wiring 310p may be bonded to a third input/output pad 116p or a fourth input/output pad 116o. Since the third input/output pad 116p and the fourth input/output pad 116o are electrically connected, the second wiring 310p may be connected to either the third input/output pad 116p or the fourth input/output pad 116o. The second wiring 310p may be a wire formed of a conductor. The second wiring 310p may be, for example, a metal wire. The other end of the second wiring 310p may be bonded to the second extending input/output pad 210b.

Since the second extending input/output pad 210b is positioned farther from horizontal positions of the first to fourth input/output pads than the first extending input/output pad 210a, the second wiring 310p may be offset relative to the first wiring 310r.

A semiconductor device according to an embodiment of the present inventive concepts will be described with reference to FIG. 5. In an embodiment described with reference to FIG. 5, first and second through vias are not provided and a bonding wire of a wiring structure is connected to all of the first to fourth input/output pads.

Figure 5:
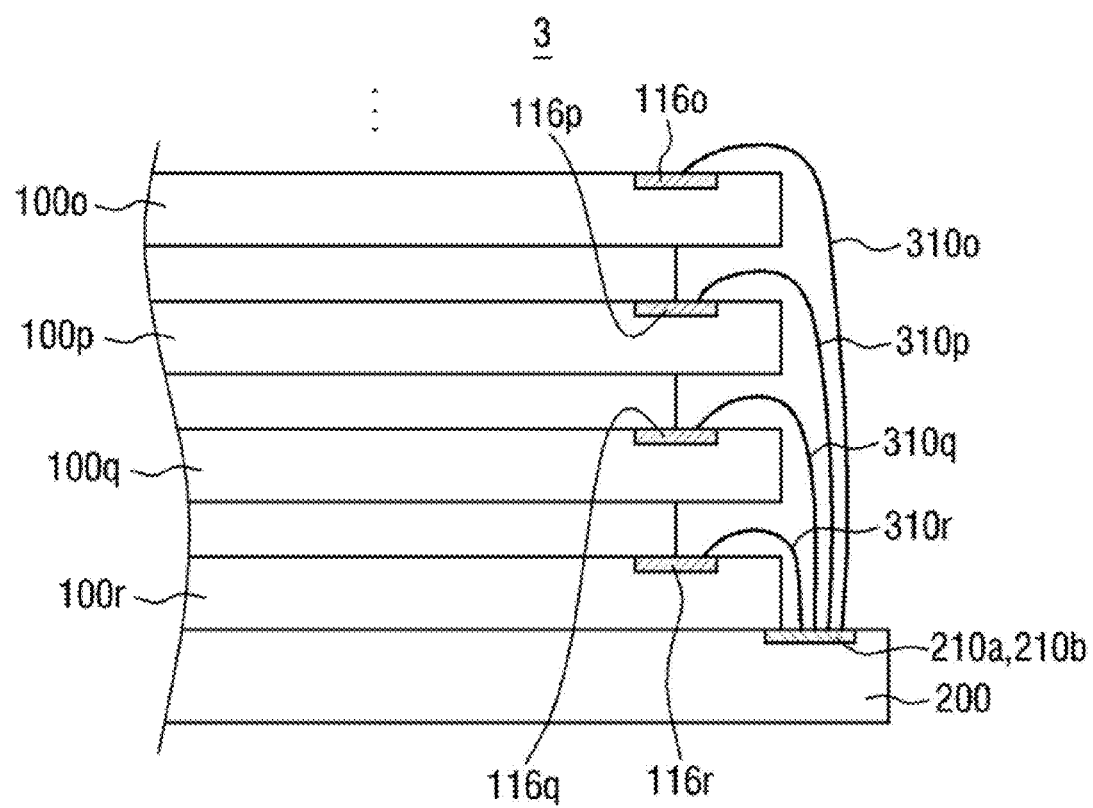
FIG. 5 is a partially cut-away side view for explaining a semiconductor device according to an embodiment of the present inventive concepts.

FIG. 5 is a partially cut-away side view for explaining a semiconductor device according to an embodiment of the present inventive concepts.

Referring to FIG. 5, in the semiconductor device 3, a first wiring 310r may connect a first extending input/output pad 210a to first connecting input/output pads 116q and 116r. Here, the first wiring 310r may be connected to the first input/output pad 116r and may also be connected to the second input/output pad 116q as well. That is to say, the first wiring 310r may have multiple branches or may include initially separated multiple bonding wires.

In the semiconductor device 3, a second wiring 310p may connect a second extending input/output pad 210b to first connecting input/output pads 116o and 116p. Here, the second wiring 310p may be connected to a third input/output pad 116p and may also be connected to a fourth input/output pad 116o as well. That is to say, the second wiring 310p may have multiple branches or may include initially separated multiple bonding wires.

Since the second extending input/output pad 210b is positioned farther from horizontal positions of first to fourth input/output pads than the first extending input/output pad 210a, the second wiring 310p may be offset relative to the first wiring 310r.

In the semiconductor device 3, it is not necessary to provide a through via between chips. That is to say, a structure for connecting first memory chip 100r and a second memory chip 100q in a first memory structure 100-0 and a structure for connecting a third memory chip 100p and a fourth memory chip 100o in a second memory structure 100-1 may be provided. Therefore, a wiring process for piercing a via passing through a chip and filling the via with a conductor is simply repeated, thereby increasing the efficiency of the fabrication process while reducing the fabrication cost.

A semiconductor device according to an embodiment of the present inventive concepts will be described with reference to FIGS. 6 to 8. In an embodiment described with reference to FIGS. 6 to 8, a wiring structure is a bonding wire.

Figure 6:
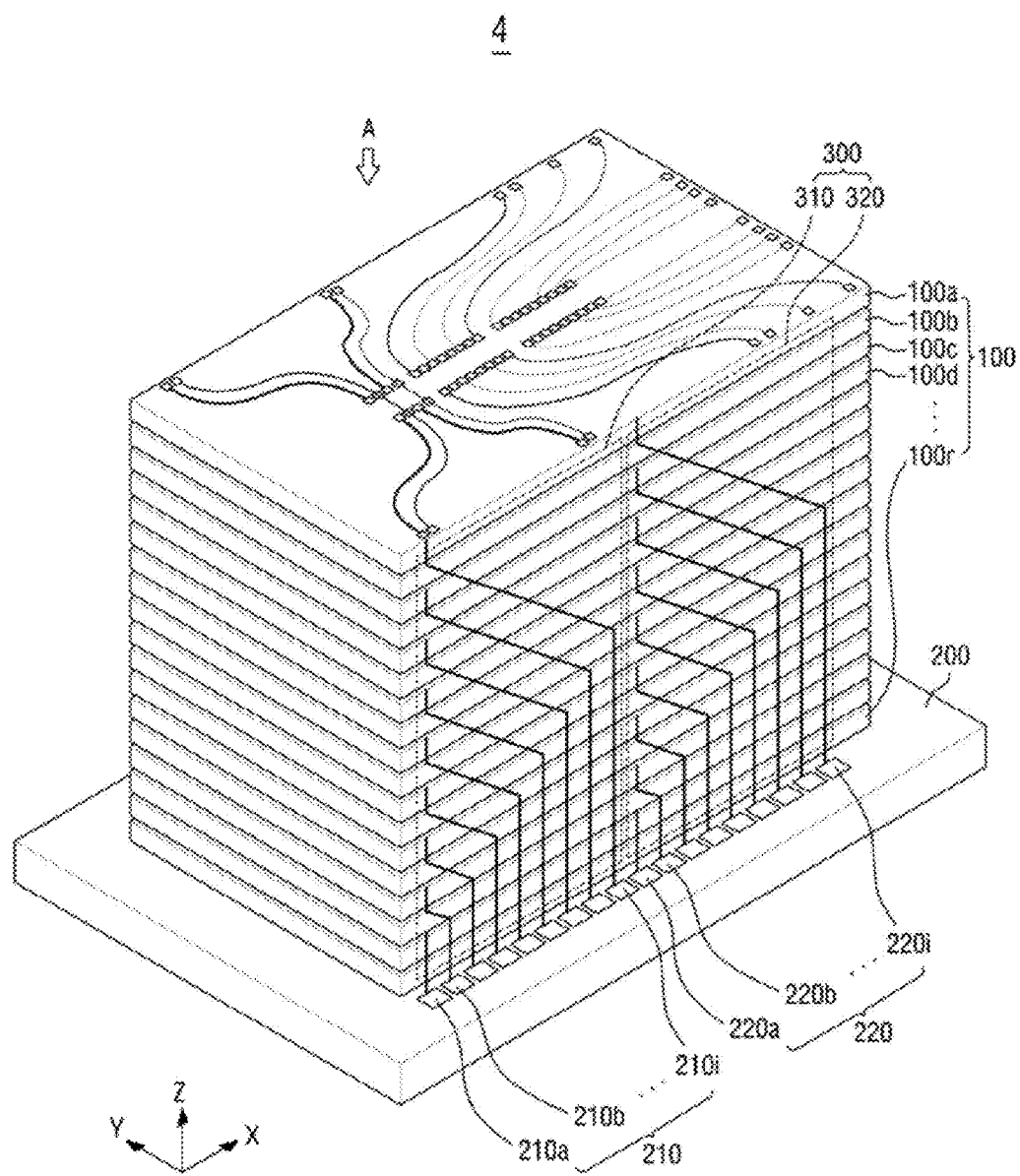
FIG. 6 is a conceptual perspective view for explaining a configuration of a semiconductor device according to an embodiment of the present inventive concepts.
Figure 7:
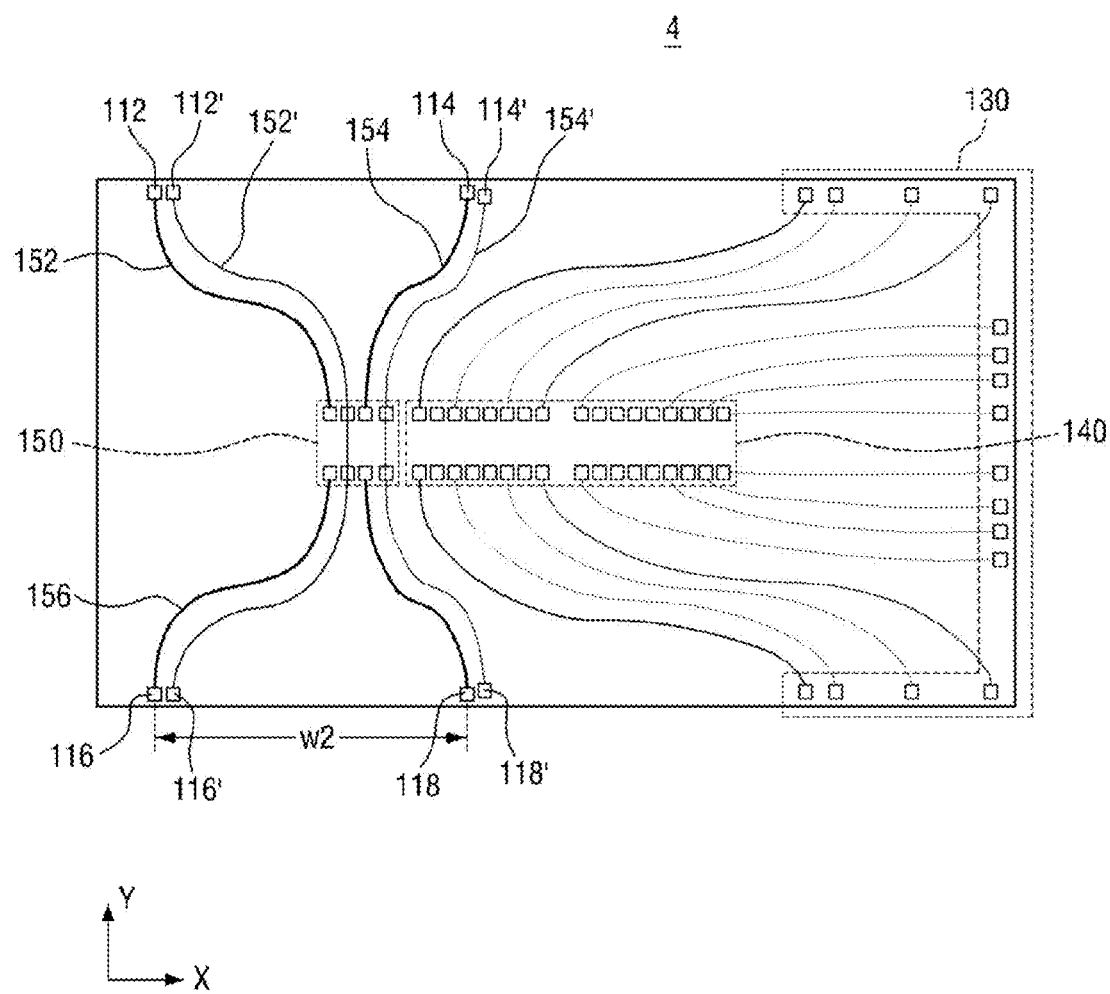
FIG. 7 is a conceptual front view for explaining a semiconductor device according to an embodiment of the present inventive concepts.
Figure 8:
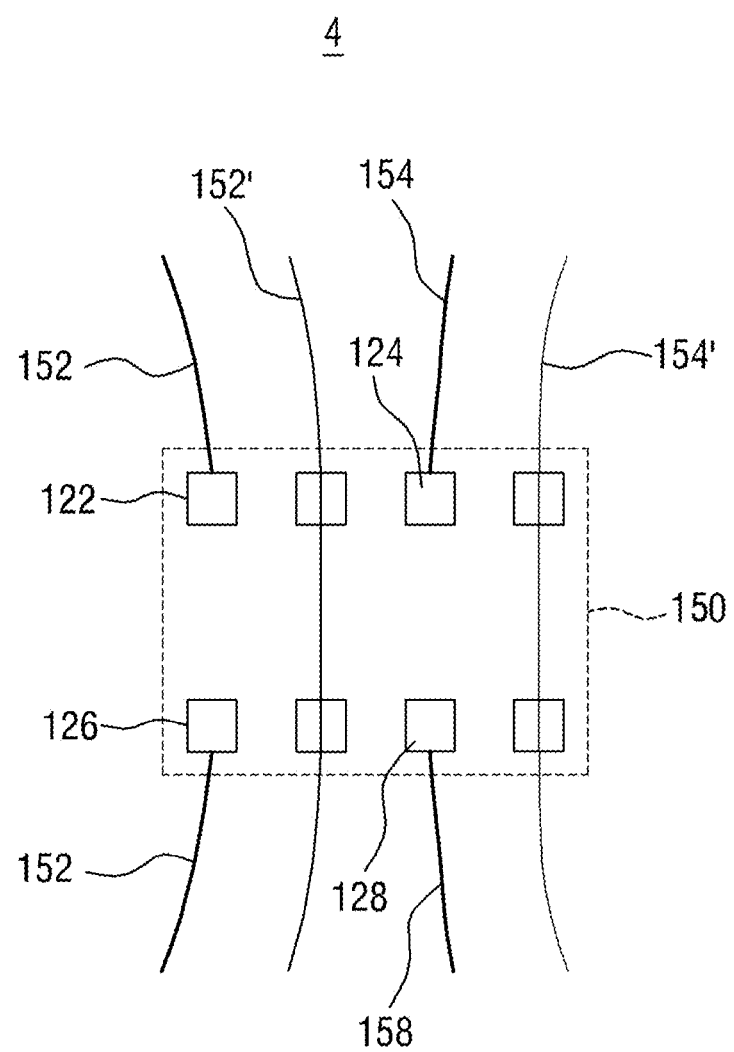
FIG. 8 is an enlarged view for explaining a center pad of a semiconductor device according to an embodiment of the present inventive concepts.

FIG. 6 is a conceptual perspective view for explaining a configuration of a semiconductor device according to an embodiment of the present inventive concepts, FIG. 7 is a conceptual front view for explaining a semiconductor device according to an embodiment of the present inventive concepts, and FIG. 8 is an enlarged view for specifically explaining a center pad of a semiconductor device according to an embodiment of the present inventive concepts.

Referring to FIG. 6, in the semiconductor device 4, input/output pads 110 may be positioned at edges of memory chips 100a, . . . , and 100r. In such a case, the input/output pads 110 are easily connected to a wiring structure 300 formed on lateral surfaces of the input/output pads 110, thereby increasing the efficiency while reducing the cost during a wiring process.

FIG. 7 is a plan view taken in a direction 'A' of FIG. 6.

Referring to FIG. 7, in the semiconductor device 4, each of the memory chips 100a, . . . , and 100r may include a center pad 150.

The center pad 150 may include input/output pads, a power pad and a ground pad of each of the memory chips 100a, . . . , and 100r. That is to say, the memory chips 100a, . . . , and 100r can be fabricated with high process efficiency by allowing various kinds of pads to concentrate on a narrow region at the time of fabricating the memory chips 100a, . . . , and 100r. A center address pad 140 for applying addresses of the memory chips 100a, . . . , and 100r may also be provided around the center pad 150.

FIG. 8 is an enlarged view illustrating the center pad shown in FIG. 7.

Referring to FIG. 8, the center pad 150 may include center input/output pads 122, 124, 126, and 128, a center power pad 152' and a center ground pad 154'. The center input/output pads 122, 124, 126, and 128 are separated from each other, while the center power pad 152' and the center ground pad 154' are connected to each other.

Referring back to FIG. 7, the center pad 150 is directly connected to an internal memory device. However, as described above, since pads are positioned at an edge of the stack structure 100, the pads are redistributed. That is to say, as shown in FIG. 7, the center pad 150 may be connected to the input/output pads 110, the power pad and the ground pad positioned at the edges of the memory chips 100a, . . . , and 100r. The connection mechanism may include input/output redistribution lines 152, 154, 156 and 158, a power redistribution line 152' and a ground redistribution line 154'. The center address pad 140 may be redistributed in an edge address pad 130 by address redistribution lines.

In the semiconductor device 4, the center pad 150 is redistributed to the edges of the memory chips 100a, . . . , and 100r, thereby increasing the efficiency of the semiconductor device 4 while reducing the fabrication cost of a wiring structure 300 on lateral surfaces of the stack structure 100.

Figure 9:
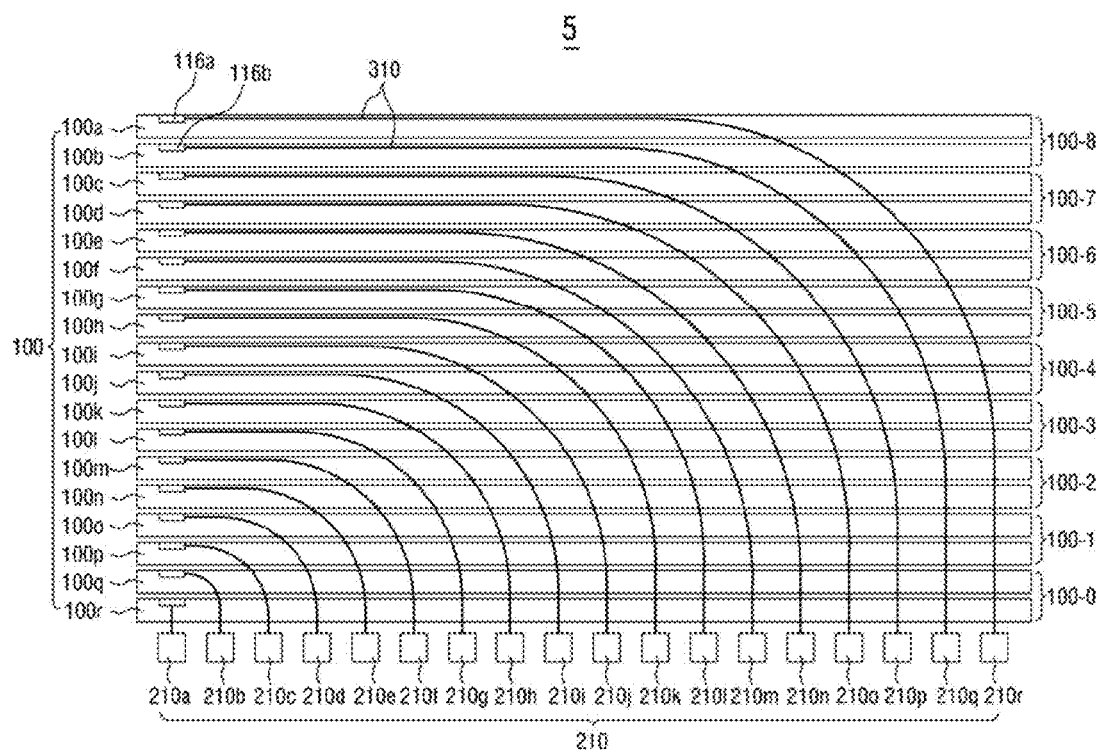
FIG. 9 is a conceptual front view for explaining a semiconductor device according to an embodiment of the present inventive concepts.

In an embodiment disclosed with reference to FIG. 9, first and second wirings are curved without bent portions.

FIG. 9 is a conceptual front view for explaining a semiconductor device according to an embodiment of the present inventive concepts.

Referring to FIG. 9, in the semiconductor device 5, the first wiring 310r and the second wiring 310p may be curved.

The first wiring 310r and the second wiring 310p may be conductors formed within a wiring structure 300.

In the semiconductor device 5, since the first wiring 310r and the second wiring 310p are formed without bent portions, they may have lower resistance than a wiring with a bent portion and the first wiring 310r and the second wiring 310p can maintain constant resistance without a resistance difference between wirings along the wiring extending direction. In addition, since a constant distance between wirings can be easily maintained, a risk of occurrence of short-circuit in each wiring can be reduced.

In FIG. 9, the memory structures 100-0, . . . , and 100-8 each in pair corresponding to each of the memory chips 100a, . . . , and 100r are illustrated, but aspects of the present inventive concepts are not limited thereto.

In an embodiment described with reference to FIG. 10, the semiconductor device further includes a power wiring and a ground wiring.

Figure 10:
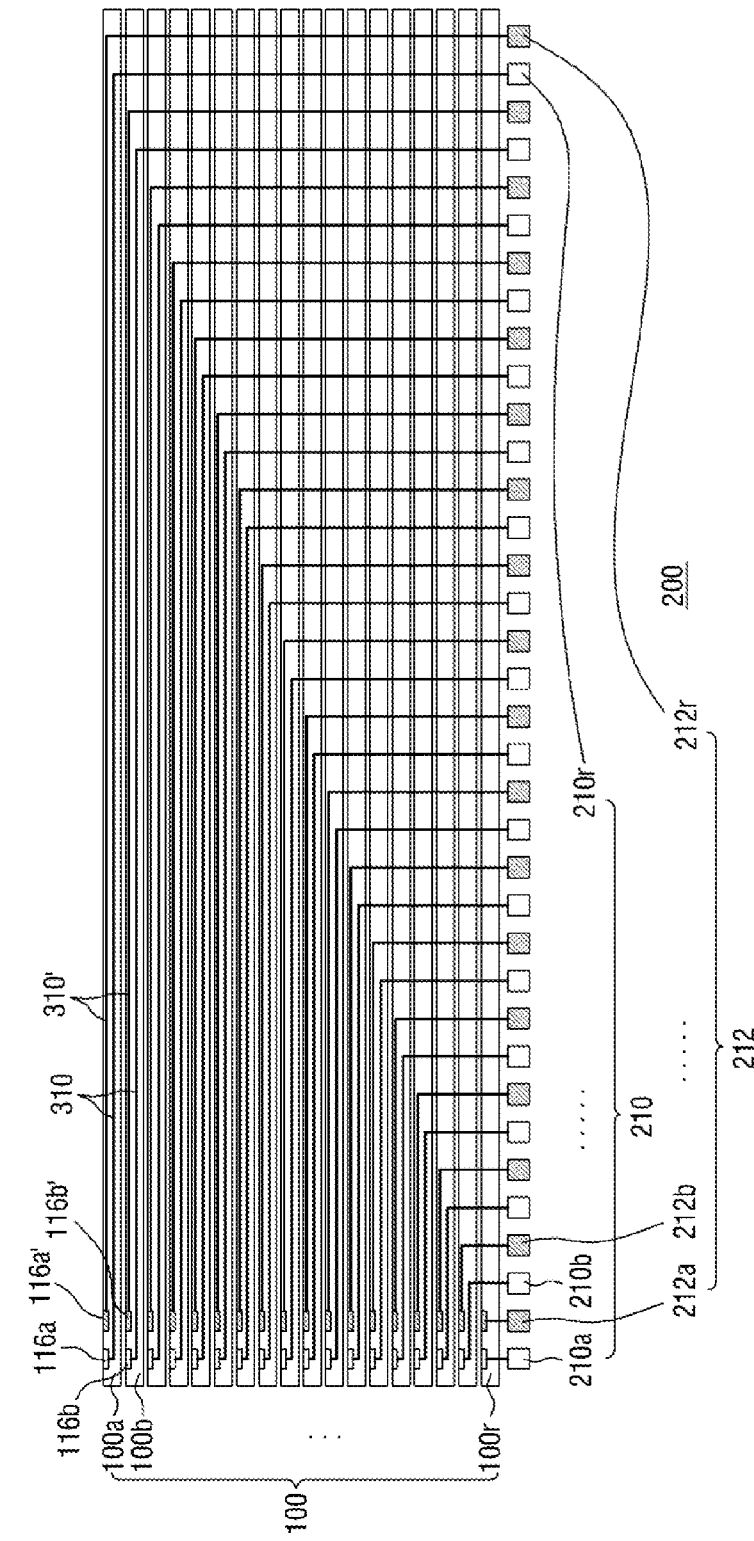
FIG. 10 is a conceptual front view for explaining a semiconductor device according to an embodiment of the present inventive concepts.

FIG. 10 is a conceptual front view for explaining a semiconductor device according to an embodiment of the present inventive concepts.

Referring to FIG. 10, a substrate 200 includes an extending power ground pad 212. The extending power ground pad 212 may be an extending power pad connected to a power supply or a grounded extending ground pad.

Each of memory chips 100a, . . . , and 100r includes power ground pads 116a', . . . , and 116r'. The power ground pads 116a', . . . , and 116r' may be power pads connected to the extending power pad or ground pads connected to the extending ground pad.

A wiring structure 300 includes a power ground wiring 310' connecting the extending power ground pads 212 and the power ground pads 116a', . . . , and 116r'. The power ground wiring 310' may be a power wiring connecting the power pads and the extending power pads or a ground wiring connecting the ground pads and the extending ground pads.

The power ground wiring 310' may be disposed between wirings connecting the input/output pads 110, including a first wiring 310r and a second wiring 310p, and the extending input/output pads 210 and 220. The power ground wiring 310' may be gradually offset in the same manner with the first wiring 310r and the second wiring 310p. That is to say, a power ground wiring 116q' of the second memory chip 100q may be offset relative to a power ground wiring 116r' of the first memory chip 100r.

In the semiconductor device 6, the wirings 310 connecting the input/output pads 110 and the extending input/output pads 210 and 220 may be interfered or short-circuited from each other, so that they are incapable of properly operating, resulting in deterioration in the reliability of the semiconductor device 6. To avoid this, power wirings or ground wirings may be disposed between each of the wirings 310. Accordingly, the semiconductor device 6 may separately input/output signals of the plurality of memory chips 100a, . . . , and 100r in a more secured manner.

In FIG. 10, the memory structures 100-0, . . . , and 100-8 each corresponding to one of the memory chips 100a, . . . , and 100r are illustrated, but aspects of the present inventive concepts are not limited thereto.

A semiconductor device according to an embodiment of the present inventive concepts will be described with reference to FIG. 11. In an embodiment described with reference to FIG. 11, the semiconductor device further includes an interposer.

Figure 11:
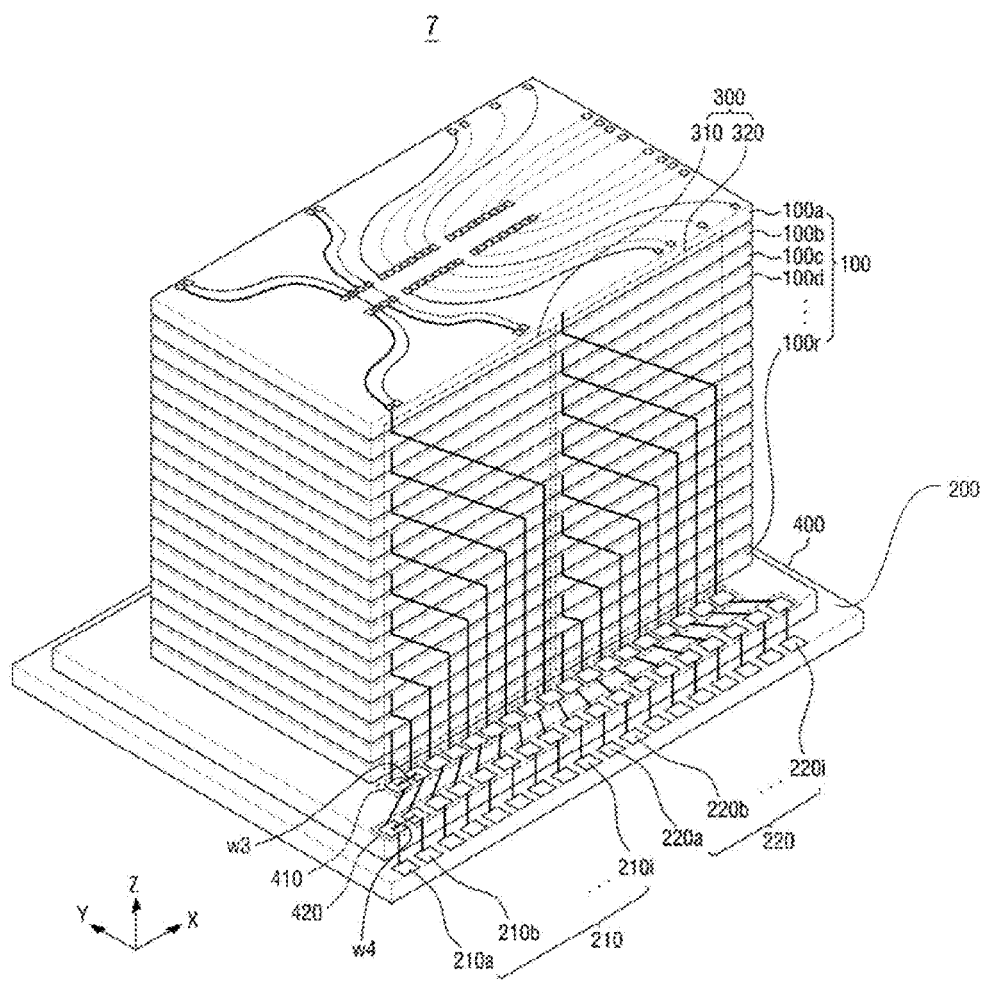
FIG. 11 is a conceptual perspective view for explaining a configuration of a semiconductor device according to an embodiment of the present inventive concepts.

FIG. 11 is a conceptual perspective view for explaining a configuration of a semiconductor device according to an embodiment of the present inventive concepts.

Referring to FIG. 11, the semiconductor device 7 further includes an interposer 400.

The interposer 400 may be an intermediate structure for establishing electrical connections between a substrate 200 and the memory chips 100a, . . . , and 100r. The interposer 400 may include, but not limited to, silicon.

The interposer 400 may be formed on the substrate 200. The interposer 400 may be disposed under a stack structure 100. That is to say, the interposer 400 may be positioned between the substrate 200 and the stack structure 100.

The interposer 400 may include interposer pads 410 and an extending interposer pads 420. In detail, the interposer pads 410 may be formed on a top surface of the interposer 400. The interposer pads 410 may correspond to wirings 310 and 320 of a wiring structure 300 in a one-to-one relationship. That is to say, first ends of the wrings 310 and 320 may be connected to input/output pads 110 of each of memory chips 100a, . . . , and 100r and second ends of the wrings 310 and 320 may be connected to the interposer pads 410. Here, the wrings 310 and 320 may be connected to the respective interposer pads 410. The interposer pads 410 may be spaced a third distance w3 apart from other interposer pads 410 that are closest thereto.

The extending interposer pads 420 may correspond to the interposer pads 410 in a one-to-one relationship. The extending interposer pads 420 may be formed on the top surface of the interposer 400, like the interposer pads 410. The extending interposer pad 420 may be spaced a fourth distance w4 apart from other interposer pads 410 that are closest thereto. The fourth distance w4 may be greater than the third distance w3. That is to say, the extending interposer pads 420 may be arranged in a greater interval than the interposer pads 410.

The extending interposer pads 420 may correspond to the extending input/output pads 210 and 220 in a one-to-one relationship. That is to say, the plurality of extending interposer pads 420 may be connected to different extending input/output pads 210 and 220 among the plurality of extending input/output pads 210 and 220, respectively.

In the present inventive concepts, memory chips 100a, . . . , and 100r may be positioned only at edges of the input/output pads 110, or centrally positioned memory chips 100a, . . . , and 100r may be redistributed to the edges of the input/output pads 110, but aspects of the present inventive concepts are not limited thereto.

The semiconductor device 7, further including the interposer 400, may increase a distance between the wrings 310 and 320. If the distance between the wrings 310 and 320 is too small, interference between the wrings 310 and 320 may occur, deteriorating the reliability of the semiconductor device 7. Therefore, like the semiconductor device 7, the distance between the wrings 310 and 320 is increased by employing the interposer 400, thereby reducing a probability of interference occurring between the wirings 310 and 320 and ultimately increasing the reliability of the semiconductor device.

A semiconductor device according to an embodiment of the present inventive concepts will be described with reference to FIGS. 12 and 13. In an embodiment described with reference to FIGS. 12 and 13, a wiring structure exists within a stack structure and the stack structure is offset to be stacked.

Figure 12:
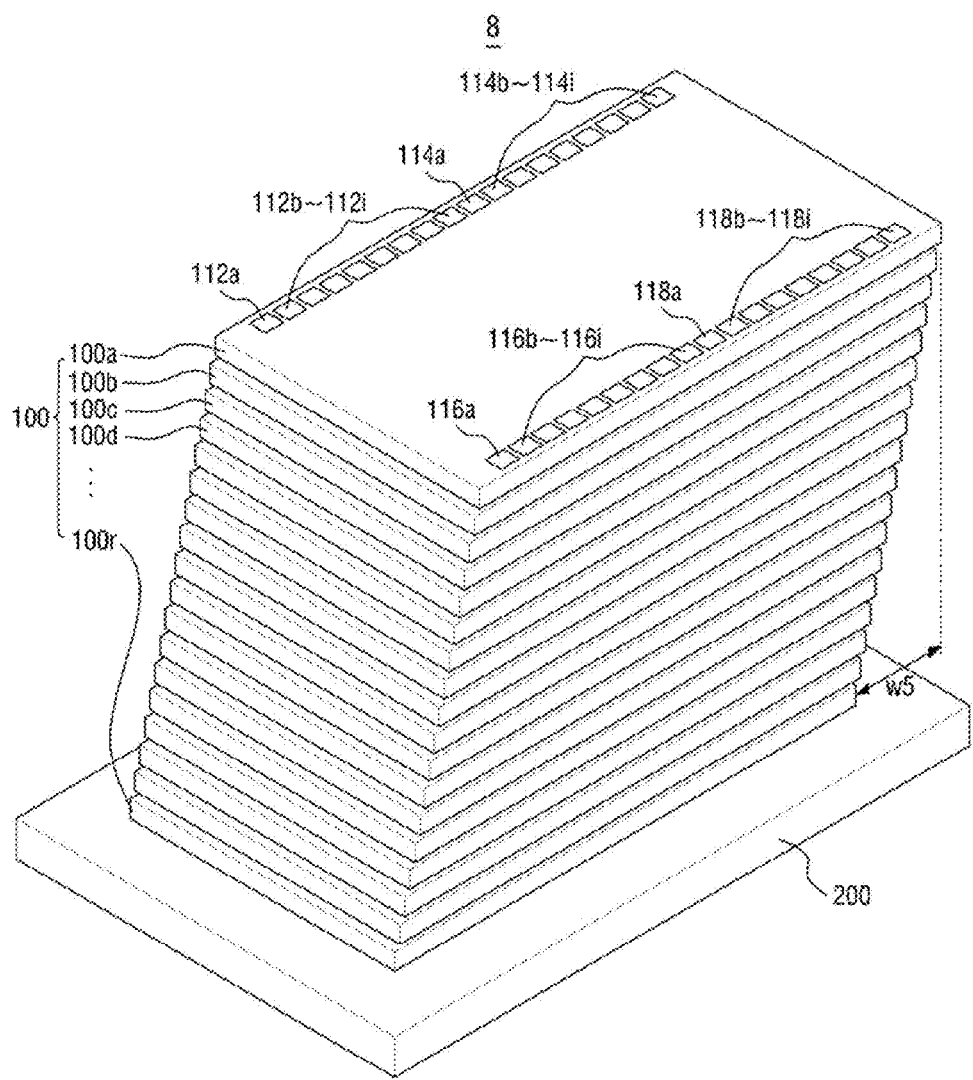
FIG. 12 is a conceptual perspective view for explaining a configuration of a semiconductor device according to an embodiment of the present inventive concepts.
Figure 13:
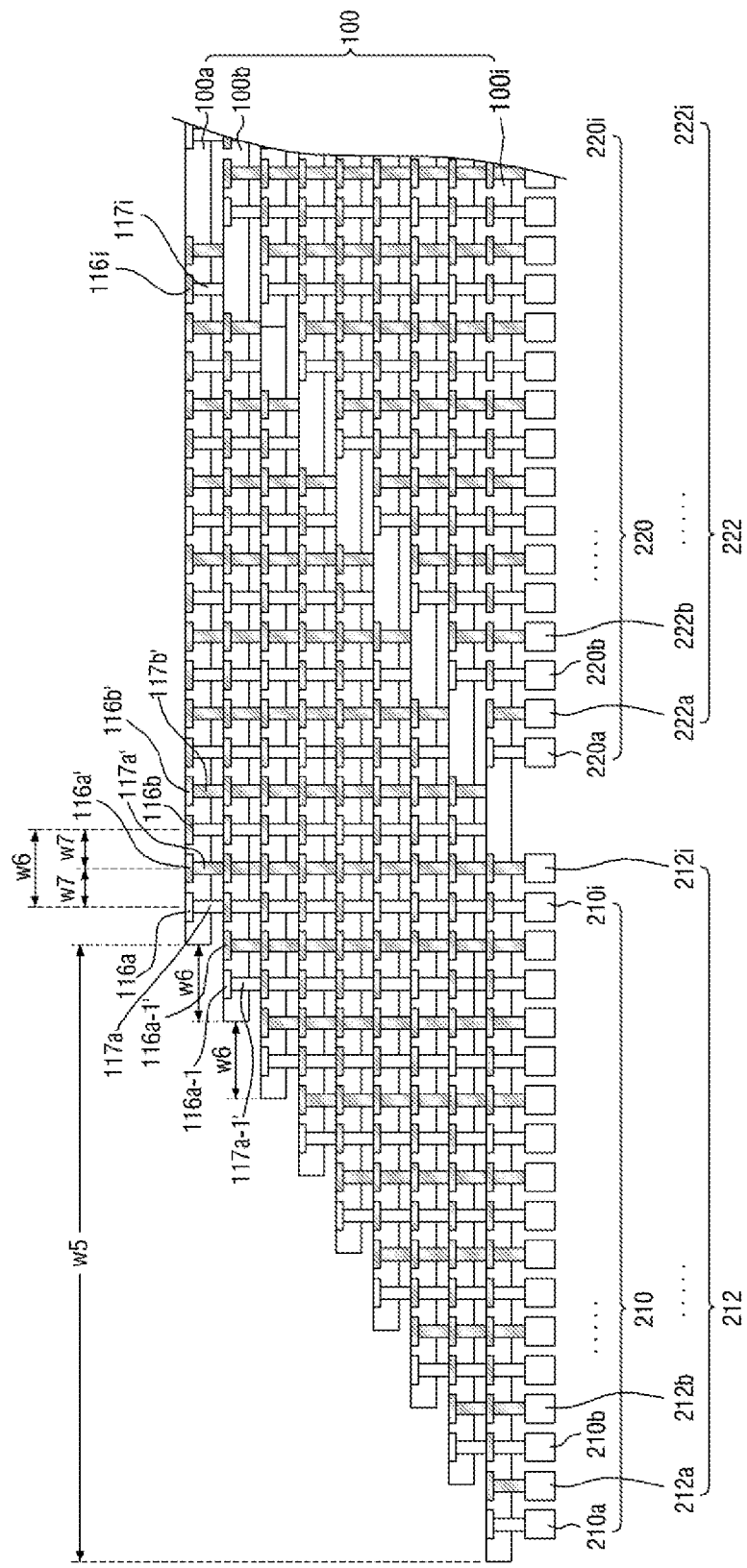
FIG. 13 is a front view for explaining a semiconductor device according to an embodiment of the present inventive concepts.

FIG. 12 is a conceptual perspective view for explaining a configuration of a semiconductor device according to an embodiment of the present inventive concepts and FIG. 13 is a front view for explaining a semiconductor device according to an embodiment of the present inventive concepts.

Referring to FIGS. 12 and 13, in the semiconductor device 8, a substrate 200 includes extending input/output pads 210 and 220 and extending power ground pads 212 positioned under a stack structure 100. That is to say, the stack structure 100 may cover the extending input/output pads 210 and 220 and the extending power ground pad 212.

Each of memory chips 100a, . . . , and 100i may include input/output pads 112a, 114a, 116a, and 118a and dummy input/output pads 112b to 112i, 114b to 114i, 116b to 116i, and 118b to 118i. The dummy input/output pads 112b to 112i, 114b to 114i, 116b to 116i, 118b to 118i may be arranged next to the input/output pads 112a, 114a, 116a, and 118a at a constant interval. The dummy input/output pads 112b to 112i, 114b to 114i, 116b to 116i, and 118b to 118i may include a plurality of dummy input/output pads.

Referring to FIG. 13, the input/output pads 116a, 116a-1, . . . , and 116a-8 may be connected to the extending input/output pads 210. Signals of the memory chips 100a, . . . , and 100i may be input/output to/from the input/output pads 116a, 116a-1, . . . , and 116a-8.

However, signals of the memory chips 100a, . . . , and 100i may not be input/output to the dummy input/output pads 116b to 116i, 116b-1 to 116i-1, . . . , and 116b-8 to 116i-8, unlike the input/output pads 116a, 116a-1, . . . , and 116a-8. Rather, the dummy input/output pads 116b to 116i, 116b-1 to 116i-1, . . . , and 116b-8 to 116i-8 may function just to connect the input/output pads 116a, 116a-1, . . . , and 116a-8 of other memory chips 100a, . . . , and 100i to the extending input/output pads 210 and 220.

The memory chips 100a, . . . , and 100i include through vias 117a to 117i, . . . , and 117a-8 to 117i-8 connected to the input/output pads 116a, 116a-1, . . . , and 116a-8 and the dummy input/output pads 116b to 116i, 116b-1 to 116i-1, . . . , and 116b-8 to 116i-8, respectively. The respective through vias 117a to 117i, . . . , and 117a-8 to 117i-8 may be formed while passing through the respective memory chips 100a, . . . , and 100i. The input/output pads 116a, 116a-1, . . . , and 116a-8 are vertically connected to the extending input/output pads 210 and 220 by the through vias 117a to 117i, . . . , and 117a-8 to 117i-8.

As shown, the input/output pads 116a, 116a-1, . . . , and 116a-8 may be spaced a sixth distance w6 apart from the dummy input/output pads 116b, . . . , and 116b-8, respectively. In addition, the dummy input/output pads 126b 116b to 116i, 116b-1 to 116i-1, . . . , and 116b-8 to 116i-8 may also be spaced a sixth distance w6 apart from other dummy input/output pads 116b to 116i, 116b-1 to 116i-1, . . . , and 116b-8 to 116i-8 that are closest thereto on the same memory chip 100a, . . . , 100i, respectively.

The respective memory chips 100a, . . . , and 100h may be horizontally offset relative to the directly underlying memory chips 100b, . . . , and 100i to then be stacked one on another. An offsetting distance may be the sixth distance w6. As the result of the offsetting, each of the memory chips 100a, . . . , and 100i may be shifted only one space at a time to then be aligned such that the input/output pads 116a, 116a-1, . . . , and 116a-8 overlap with the dummy input/output pads 116b to 116i, 116b-1 to 116i-1, . . . , and 116b-8 to 116i-8. Therefore, a distance between the bottommost memory chip 100i and the topmost memory chip 100a may be the fifth distance w5. The fifth distance w5 may be equal to a multiplication product of the sixth distance w6 and the number of memory chips 100a, . . . , and 100i. In a case where the memory structures 100-0, . . . , and 100-8 include a plurality of memory chips 100a, . . . , and 100i, instead of one of the memory chips 100a, . . . , and 100i, the number of memory structures 100-0, . . . , and 100-8 is multiplied with the sixth distance w6 to yield the fifth distance w5.

In the memory chips 100a, . . . , and 100i, power ground pads 116a', 116a-1', . . . , and 116a-8' may be connected to the extending power ground pad 212. Power of the memory chips 100a, . . . , and 100i may be applied to the power ground pads 116a', 116a-1', . . . , and 116a-8', or the memory chips 100a, . . . , and 100i may be grounded.

The dummy power ground pads 116a', to 116i', 116b-1' to 116i-1', . . . , and 116b-8' to 116i-8' may not be connected with power and ground of the memory chips 100a, . . . , and 100i, unlike the power ground pads 116a', 116a-1', . . . , and 116a-8'. Rather, the dummy power ground pads 116b' to 116i', 116b-1' to 116i-1', . . . , and 116b-8' to 116i-8' may function just to connect the power ground pads 116a', 116a-1', . . . , and 116a-8' of other memory chips 100a, . . . , and 100i to the extending power ground pad 212.

Each of memory chips 100a, . . . , and 100i may include power ground through vias 117a' to 117i', . . . , and 117a-8' to 117i-8' connected to the power ground pads 116a', 116a-1', . . . , and 116a-8' and the dummy power ground pads 116b' to 116i', 116b-1' to 116i-1', . . . , and 116b-8' to 116i-8'. The respective power ground through vias 117a' to 117i', . . . , and 117a-8' to 117i-8' may be formed while passing through the respective memory chips 100a, . . . , and 100i. The power ground pads 116a', 116a-1', . . . , and 116a-8' are vertically connected to the extending power ground pad 212 by the power ground through vias 117a' to 117i', . . . , and 117a-8' to 117i-8'.

As shown, the power ground pads 116a', 116a-1', . . . , and 116a-8' may be spaced the sixth distance w6 apart from the dummy power ground pads 116b' to 116i', 116b-1' to 116i-1', . . . , and 116b-8' to 116i-8'. In addition, the dummy power ground pads 116b' to 116i', 116b-1' to 116i-1', . . . , and 116b-8' to 116i-8' may also be spaced the sixth distance w6 apart from other dummy power ground pads 116b' to 116i', 116b-1' to 116i-1', . . . , and 116b-8' to 116i-8' that are closest thereto on the same memory chip 100a, . . . , 100i, respectively.

The respective memory chips 100a, . . . , and 100i may be horizontally offset relative to the directly underlying memory chips 100a, . . . , and 100i to then be stacked one on another. An offsetting distance may be the sixth distance w6. As the result of the offsetting, each of the memory chips 100a, . . . , and 100i may be shifted only one space at a time to then be aligned such that the power ground pads 116a', 116a-1', . . . , and 116a-8' overlap with the dummy power ground pads 116b' to 116i', 116b-1' to 116i-1', . . . , and 116b-8' to 116i-8'.

The input/output pads 116a, 116a-1, . . . , and 116a-8 and the power ground pads 116a', 116a-1', . . . , and 116a-8' may be spaced a seventh distance w7 apart from on the memory chip 100a, . . . , 100i. In addition, the power ground pads 116a', 116a-1', . . . , and 116a-8' may be spaced the seventh distance w7 apart from the dummy input/output pads 116b, . . . , and 116b-8, respectively. The seventh distance w7 may be half the fifth distance w6, but aspects of the present inventive concepts are not limited thereto, so long as a sum of a distance between each of the input/output pads 116a, 116a-1, . . . , and 116a-8 and each of the power ground pads 116a', 116a-1', . . . , and 116a-8' and a distance between each of the power ground pads 116a', 116a-1', . . . , and 116a-8' and each of the dummy input/output pads 116b, . . . , and 116b-8 is equal to the sixth distance w6.

Through vias formed while passing through the chips may be through silicon vias (TSVs), but not limited thereto.

In the semiconductor device 8, the input/output pad and the extending input/output pad are connected with the shortest distance, thereby considerably improving the wiring efficiency. In addition, since power and ground lines are disposed between each of input/output lines, a probability of occurrence of interference and short-circuit between the input/output lines may be greatly reduced. Therefore, many extending input/output pads can be provided with a small number of input/output pads. In addition, since signals are transmitted over the shortest distance, power efficiency can be improved and a risk of signal loss can also be reduced.

In FIGS. 12 and 13, the memory structures 100-0, . . . , and 100-8 each corresponding to one of the memory chips 100a, . . . , and 100i are illustrated, but aspects of the present inventive concepts are not limited thereto. That is to say, the memory structures 100-0, . . . , and 100-8 may include a plurality of memory chips 100a, . . . , and 100i. In this case, the memory chips 100a, . . . , and 100i included in the same memory structure 100-0, . . . , 100-8 may be stacked without being offset and may be vertically connected to each other without being shifted.

A semiconductor device 9 according to an embodiment of the present inventive concepts will be described with reference to FIG. 14. In an embodiment described with reference to FIG. 14, through vias are diagonally formed and a stack structure is not offset.

Figure 14:
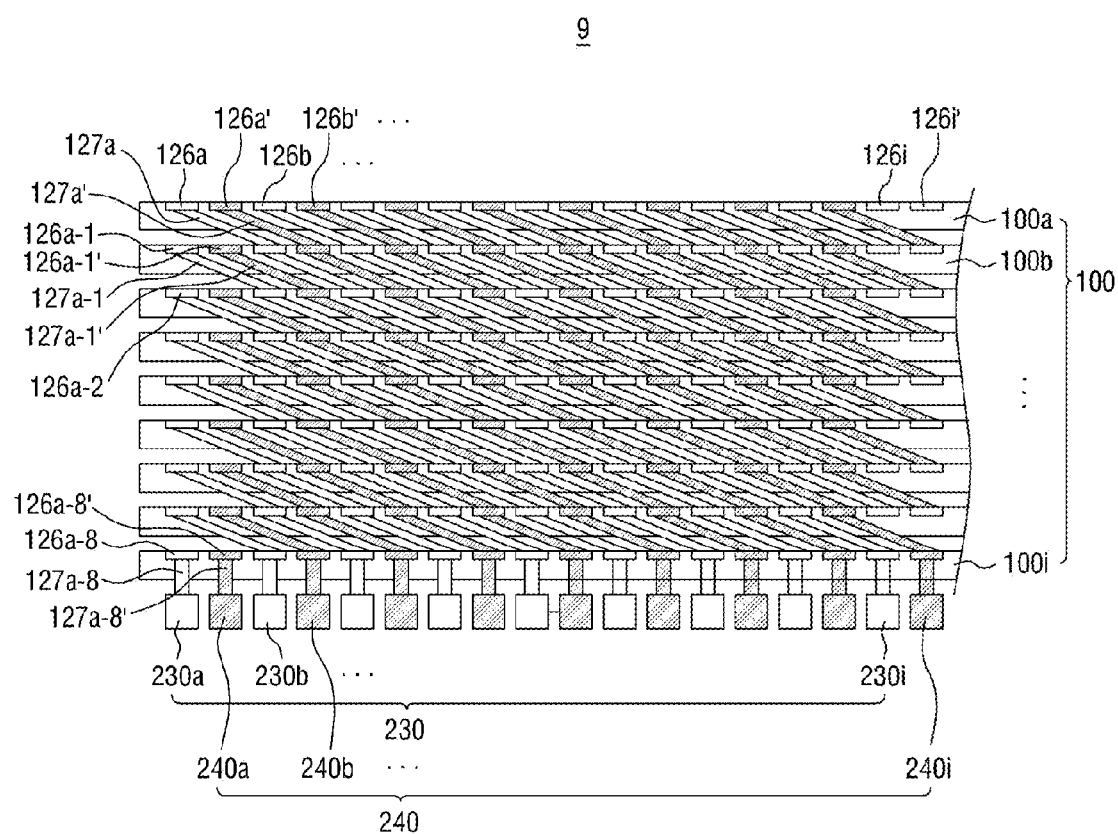
FIG. 14 is a conceptual front view for explaining a configuration of a semiconductor device according to an embodiment of the present inventive concepts.

FIG. 14 is a conceptual front view for explaining a configuration of a semiconductor device according to an embodiment of the present inventive concepts.

Referring to FIG. 14, each of memory chips 100a, . . . , and 100i may include input/output pads 126a, 126a-1, . . . , and 126a-8 and dummy input/output pads 126b to 126i, 126b-1 to 126i-1, . . . , and 126b-8 to 126i-8.

The input/output pads 126a, 126a-1, . . . , and 126a-8 may be connected to the extending input/output pads 210. Signals of the memory chips 100a, . . . , and 100i may be input/output to/from the input/output pads 126a, 126a-1, . . . , and 126a-8.

However, signals of the memory chips 100a, . . . , and 100i may not be input/output to the dummy input/output pads 126b to 126i, 126b-1 to 126i-1, . . . , and 126b-8 to 126i-8, unlike the input/output pads 116a, 116a-1, . . . , and 116a-8. Rather, the dummy input/output pads 126b to 126i, 126b-1 to 126i-1, . . . , and 126b-8 to 126i-8 may function just to connect the input/output pads 126a, 126a-1, . . . , and 126a-8 of other memory chips 100a, . . . , and 100i to the extending input/output pads 210 and 220.

The memory chips 100a, . . . , and 100i include through vias 127a to 127i, . . . , and 127a-8 to 127i-8 connected to the input/output pads 126a, 126a-1, . . . , and 126a-8 and the dummy input/output pads 126b to 126i, 126b-1 to 126i-1, . . . , and 126b-8 to 126i-8. The respective through vias 127a to 127i, . . . , and 127a-8 to 127i-8 may be formed while passing through the respective memory chips 100a, . . . , and 100i. The input/output pads 126a, 126a-1, . . . , and 126a-8 are connected to the extending input/output pads 210 and 220 by the through vias 127a to 127i, . . . , and 127a-8 to 127i-8.

The through vias 127a to 127i, . . . , and 127a-8 to 127i-8 are diagonally formed. In detail, the through vias 127a to 127i, . . . , and 127a-8 to 127i-8 are connected to the input/output pads 126a, 126a-1, . . . , and 126a-8 or the dummy input/output pads 126b-1 to 126i-1, . . . , and 126b-8 to 126i-8 on the directly underlying memory chip 100b, . . . , 100i having horizontal positions of the dummy input/output pads 126b to 126i, 126b-1 to 126i-1, . . . , and 126b-8 to 126i-8 that are closest to the dummy input/output pads 126b to 126i, 126b-1 to 126i-1, . . . , and 126b-8 to 126i-8. That is to say, each of the input/output pads 126a, 126a-1, . . . , and 126a-8 may be shifted only one space at a time to then be diagonally connected to the extending input/output pads 210 and 220.

In the memory chips 100a, . . . , and 100i, power ground pads 126a', 126a-1', . . . , and 126a-8' may be connected to the extending power ground pad 212. Power of the memory chips 100a, . . . , and 100i may be applied to the power ground pads 126a', 126a-1', . . . , and 126a-8', or the memory chips 100a, . . . , and 100i may be grounded.

The dummy power ground pads 126b' to 126i', 126b-1' to 126i-1', . . . , 126b-8' to 126i-8' may not be connected with power and ground of the memory chips 100a, . . . , and 100i, unlike the power ground pads 126a', 126a-1', . . . , and 126a-8' . . . . Rather, the dummy power ground pads 126b' to 126i', 126b-1' to 126i-1', . . . , and 126b-8' to 126i-8' may function just to connect the power ground pads 126a', 126a-1', . . . , and 126a-8' of other memory chips 100a, . . . , and 100i to the extending power ground pad 212.

The memory chips 100a, . . . , and 100i include power ground through vias 127a' to 127i', . . . , and 127a-8' to 127i-8' connected to the power ground pads 126a', 126a-1', . . . , and 126a-8' and the dummy power ground pads 126b' to 126i', 126b-1' to 126i-1', . . . , and 126b-8' to 126i-8'. The power ground through vias 127a' to 127i', . . . , and 127a-8' to 127i-8' may be formed while passing through the respective memory chips 100a, . . . , and 100i. The power ground pads 126a', 126a-1', . . . , and 126a-8' are connected to the extending power ground pad 212 by the power ground through vias 127a' to 127i', . . . , and 127a-8' to 127i-8'.

The power ground through vias 127a' to 127i', . . . , and 127a-8' to 127i-8' are diagonally formed. In detail, the power ground through vias 127a' to 127i', . . . , and 127a-8' to 127i-8' are connected to the input/output pads 126a', 126a-1', . . . , and 126a-8' or the dummy input/output pads 126b to 126i, 126b-1 to 126i-1, . . . , and 126b-8 to 126i-8 on the directly underlying memory chip 100b, . . . , 100i having horizontal positions of the dummy input/output pads 126b to 126i, 126b-1 to 126i-1, . . . , and 126b-8 to 126i-8 that are closest to the dummy input/output pads 126b' to 126i', 126b-1' to 126i-1', . . . , and 126b-8' to 126i-8'. That is to say, each of the input/output pads 126a', 126a-1', . . . , and 126a-8' may be shifted only one space at a time to then be diagonally connected to the extending power ground pad 212.

In the semiconductor device 9 an embodiment of the present inventive concepts, it is not necessary to provide an offset in stacking the memory chips, thereby increasing processing efficiency. In addition, since the stack structure 100 occupies a reduced volumetric area, the integration level of the semiconductor device 9 can be improved.

In FIG. 14, the memory structures 100-0, . . . , and 100-8 each corresponding to one of the memory chips 100a, . . . , and 100i are illustrated, but aspects of the present inventive concepts are not limited thereto. That is to say, the memory structures 100-0, . . . , and 100-8 may include a plurality of memory chips 100a, . . . , and 100i. In this case, the memory chips 100a, . . . , and 100i included in the same memory structure 100-0, . . . , 100-8 may include vertical through vias without diagonal through vias. That is to say, diagonal through vias are provided between each of the memory structures 100-0, . . . , and 100-8 and vertical through vias may be provided within the same memory structure 100-0, . . . , 100-8.

Figure 15:
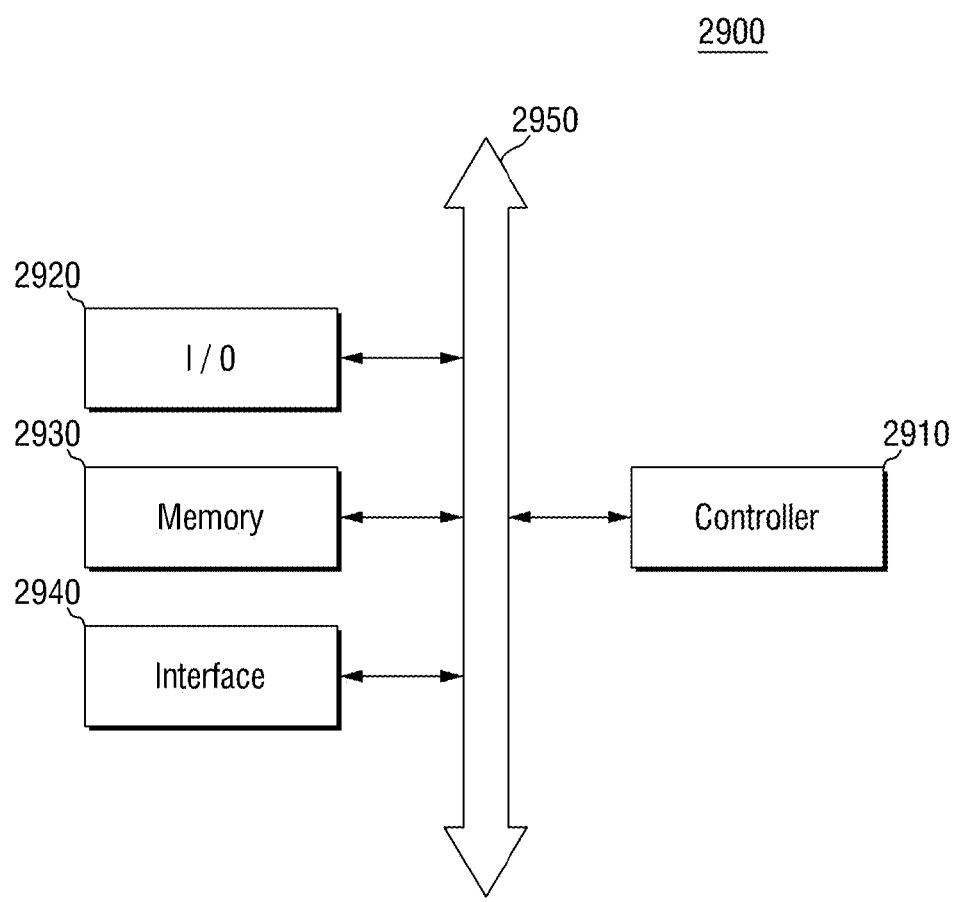
FIG. 15 is a block diagram illustrating an example electronic system including semiconductor devices according to some embodiments of the present inventive concepts.

FIG. 15 is a block diagram illustrating an example electronic system including semiconductor devices according to some embodiments of the present inventive concepts.

Referring to FIG. 15, the electronic system 2900 may include a controller 2910, an input/output device (I/O) 2920, a memory 2929, an interface 2940 and a bus 2950. The controller 2910, the I/O 2920, the memory 2929, and/or the interface 2940 may be connected to one another through the bus 2950. The bus 2950 may correspond to a path through which data moves. The controller 2910 may include at least one of a microprocessor, a digital signal processor, a microcontroller, and logic elements capable of functions similar to those of these elements. The I/O 2920 may include a keypad, a keyboard and a display. The memory 2929 may store data and/or commands. The memory 2929 may include semiconductor devices according to some embodiments of the present inventive concepts. The memory 2929 may include a DRAM. The interface 2940 may perform functions of transmitting data to a communication network or receiving data from a communication network. The interface 2940 may be wired or wireless. For example, the interface 2940 may include an antenna or a wired/wireless transceiver, and so on.

The electronic system 2900 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 16:
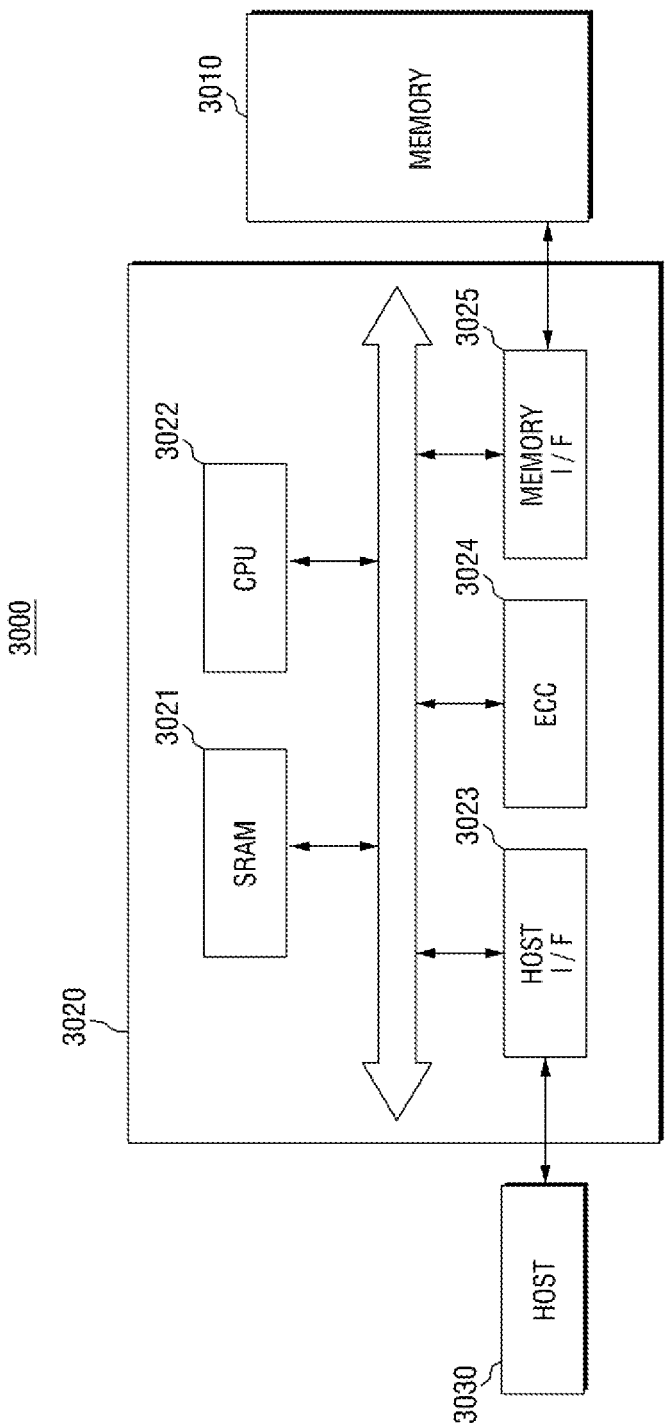
FIG. 16 is a block diagram illustrating an example memory card employing a memory including semiconductor devices according to some embodiments of the present inventive concepts.

FIG. 16 is a block diagram illustrating an example memory card employing a memory including semiconductor devices according to some embodiments of the present inventive concepts.

Referring to FIG. 16, a memory 3010 including semiconductor devices may be employed to a memory card 3000. The memory card 3000 may include a memory controller 3020 controlling data exchange between a host 3030 and the memory 3010. A static random access memory (SRAM) 3021 may be used as a working memory of a central processing unit (CPU) 3022. A host interface 3023 may include a protocol for exchanging data by allowing the host 3030 to access the memory card 3000. An error correction code 3024 may be used to detect errors of the data read from the memory 3010. A memory interface 3025 may interface with the memory 3010. The CPU 3022 may perform the overall control operation associated with the data exchange of the memory controller 3020.

Figure 17:
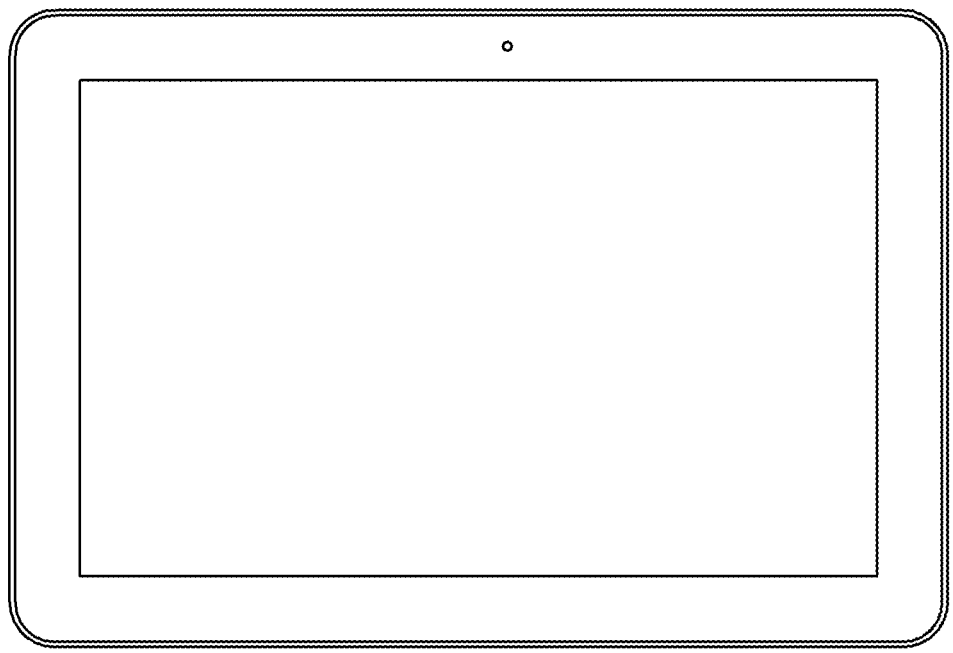
FIGS. 17 and 18 illustrate an example semiconductor system to which semiconductor devices according to some embodiments of the present inventive concepts can be employed.
Figure 18:
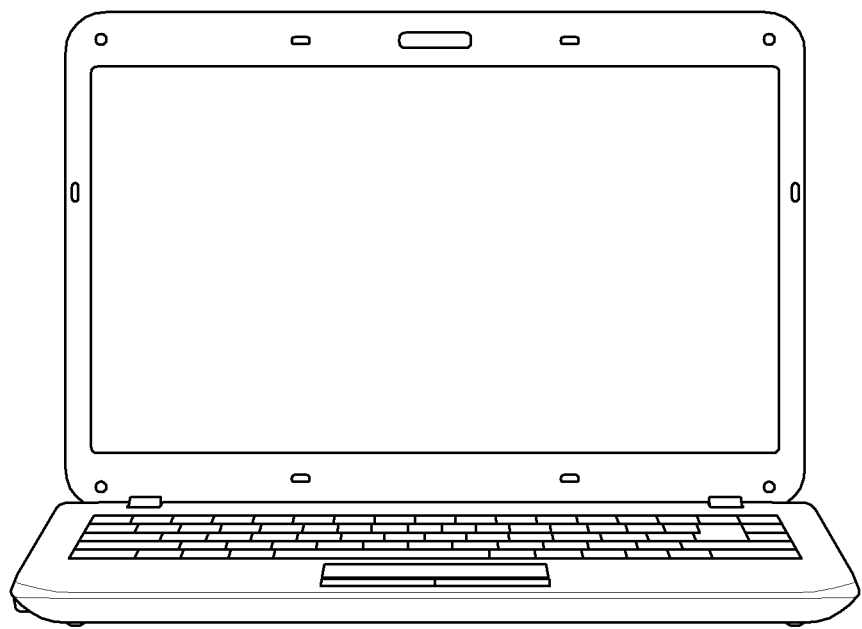

FIGS. 17 and 18 illustrate an example semiconductor system to which semiconductor devices according to some embodiments of the present inventive concepts can be employed.

FIG. 17 illustrates an example in which a semiconductor device according to an embodiment of the present inventive concepts is applied to a tablet PC, and FIG. 18 illustrates an example in which a semiconductor device according to an embodiment of the present inventive concepts is applied to a notebook computer. It is obvious to one skilled in the art that the semiconductor devices according to some embodiments of the present inventive concepts may also be applied to other IC devices not illustrated herein.

While the present inventive concepts has been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
    a substrate including first and second extending input/output pads;
    a first memory structure on the substrate and including first connecting input/output pads;
    a second memory structure on the first memory structure and including second connecting input/output pads; and
    a wiring structure formed on lateral surfaces of the first and second memory structures and connecting the first connecting input/output pads of the first and second memory structures with the first and second extending input/output pads of the substrate, respectively,
    wherein the wiring structure includes a first wiring connecting the first connecting input/output pads of the first memory structure and the first extending input/output pad of the substrate and a second wiring connecting the first connecting input/output pads of the second memory structure and the second extending input/output pad of the substrate, and the second wiring is offset relative to the first wiring,
    wherein the substrate further includes an extending power pad connected to a power supply and an extending ground pad that is grounded, the first memory structure further includes a power pad and a ground pad, the wiring structure further includes a power wiring connecting the power pad and the extending power pad and a ground wiring connecting the ground pad and the extending ground pad, and the power wiring or the ground wiring are disposed between the first and second wirings.

2. The semiconductor device of claim 1, wherein the first memory structure includes a plurality of memory chips.

3. The semiconductor device of claim 2, wherein the plurality of memory chips include a first memory chip and a second memory chip disposed on the first memory chip, the first connecting input/output pads include a first input/output pad included in the first memory chip and a second input/output pad included in the second memory chip, and the second memory chip includes a through via passing through the second memory chip and connecting the first and second input/output pads.

4. The semiconductor device of claim 2, wherein the plurality of memory chips include a first memory chip and a second memory chip disposed on the first memory chip, the first connecting input/output pads include a first input/output pad included in the first memory chip and a second input/output pad included in the second memory chip, and the first wiring connects the first extending input/output pad and the first and second input/output pads of the first memory structure.

5. The semiconductor device of claim 1, further comprising:
    a third memory structure disposed on the first memory structure and including a third connecting input/output pad,
    wherein the extending input/output pads include a third extending input/output pad,
    wherein the wiring structure further includes a third wiring connecting the third connecting input/output pad and the third extending input/output pad, and wherein the third wiring is offset relative to the first and second wirings along edges of the first to third memory structures.

6. The semiconductor device of claim 1, wherein,
each given memory structure of the first and second memory structures includes a first memory chip and a second memory chip on the first memory chip,
the first connecting input/output pads of each given memory structure include a first input/output pad included in the first memory chip and a second input/output pad included in the second memory chip,
the first input/output pad of the first memory structure is positioned at an edge of the first memory structure, and
the first memory structure is electrically connected to the first input/output pad and further includes a center pad centrally positioned in the first memory structure.

7. The semiconductor device of claim 1, further comprising:
an interposer positioned between the substrate and the first memory structure, wherein the interposer includes first and second interposer pads to which the first and second wirings are connected, respectively, and first and second extending interposer pads to which the first and second extending input/output pads are connected, respectively, the first and second interposer pads are arranged at a first distance, the first and second extending interposer pads are arranged at a second distance, and the second distance is greater than or equal to the first distance.

8. The semiconductor device of claim 1, wherein the wiring structure includes a bonding wire.

9. A semiconductor device comprising:
a substrate including first and second extending input/output pads, the first and second extending input/output pads being laterally offset from each other on the substrate;
a first memory structure on the substrate;
a second memory structure on the first memory structure;
wherein each given memory structure of the first and second memory structures includes first connecting input/output pads, and the first connecting input/output pads of each given memory structure are located at a common position on the given memory structure, such that the first connecting input/output pads of the first and second memory structures vertically overlap each other; and
a wiring structure formed on lateral surfaces of the first and second memory structures and connecting the first connecting input/output pads of the first and second memory structures with the first and second extending input/output pads of the substrate, respectively;
wherein the wiring structure includes a first wiring connecting the first connecting input/output pads of the first memory structure and the first extending input/output pad of the substrate and a second wiring connecting the first connecting input/output pads of the second memory structure and the second extending input/output pad of the substrate;
wherein the substrate further includes an extending power pad connected to a power supply and an extending ground pad that is grounded, the first memory structure further includes a power pad and a ground pad, the wiring structure further includes a power wiring connecting the power pad and the extending power pad and a ground wiring connecting the ground pad and the extending ground pad, and the power wiring or the ground wiring are disposed between the first and second wirings.

10. The semiconductor device of claim 9, wherein each given memory structure of the first and second memory structures includes a plurality of memory chips.

11. The semiconductor device of claim 10, wherein,
each given memory structure of the first and second memory structures includes a first memory chip and a second memory chip on the first memory chip,
the first connecting input/output pads of each given memory structure include a first input/output pad included in the first memory chip and a second input/output pad included in the second memory chip, and
the second memory chip of each given memory structure includes a through via passing through the second memory chip and connecting the first and second input/output pads of the given memory structure, the through via not passing through the first memory chip of the given memory structure, the through via not connecting with a separate memory structure.

12. The semiconductor device of claim 11, wherein the first wiring connects the first extending input/output pad and the first and second input/output pads of the first memory structure.

13. The semiconductor device of claim 11, wherein,
the first input/output pad of the first memory structure is positioned at an edge of the first memory structure, and
the first memory structure is electrically connected to the first input/output pad and further includes a center pad centrally positioned in the first memory structure.

14. The semiconductor device of claim 9, further comprising:
a third memory structure on the first memory structure and including a third connecting input/output pad,
wherein the extending input/output pads include a third extending input/output pad,
wherein the wiring structure further includes a third wiring connecting the third connecting input/output pad and the third extending input/output pad, and
wherein the third wiring is offset relative to the first and second wirings along edges of the first to third memory structures.

15. The semiconductor device of claim 9, further comprising:
an interposer positioned between the substrate and the first memory structure, wherein the interposer includes first and second interposer pads to which the first and second wirings are connected, respectively, and first and second extending interposer pads to which the first and second extending input/output pads are connected, respectively, the first and second interposer pads are arranged at a first distance, the first and second extending interposer pads are arranged at a second distance, and the second distance is greater than or equal to the first distance.

16. The semiconductor device of claim 9, wherein the wiring structure includes a bonding wire.

* * * * *